(12) United States Patent
Yamazaki et al.

(10) Patent No.: US 10,003,023 B2
(45) Date of Patent: Jun. 19, 2018

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventors: Shunpei Yamazaki, Setagaya (JP); Takahiro Sato, Takatsuki (JP); Shunsuke Koshioka, Tochigi (JP); Rihito Wada, Atsugi (JP); Junko Suzawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days. days.

(21) Appl. No.: 15/483,618

(22) Filed: Apr. 10, 2017

(65) Prior Publication Data
US 2017/0301860 A1    Oct. 19, 2017

(30) Foreign Application Priority Data
Apr. 15, 2016 (JP) ................... 2016-082072

(51) Int. Cl.
*H01L 27/32* (2006.01)
*H01L 51/00* (2006.01)
(Continued)

(52) U.S. Cl.
CPC ........ *H01L 51/003* (2013.01); *H01L 27/3258* (2013.01); *H01L 27/3262* (2013.01);
(Continued)

(58) Field of Classification Search
CPC ... H01L 51/003; H01L 51/56; H01L 51/0097; H01L 27/3276; H01L 51/5237;
(Continued)

(56) References Cited

U.S. PATENT DOCUMENTS 7,591,863 B2    9/2009    Watanabe et al.
7,791,072 B2    9/2010    Kumomi et al.
(Continued)

FOREIGN PATENT DOCUMENTS

JP    2003-098977 A    4/2003
JP    2014-197522 A    10/2014
(Continued)

OTHER PUBLICATIONS

French.I et al., "54.2: Thin Plastic Electrophoretic Displays Fabricated by a Novel Process", SID Digest '05 : SID International Symposium Digest of Technical Papers, May 24, 2005, vol. 36, pp. 1634-1637.
(Continued)

*Primary Examiner* — David Vu
(74) *Attorney, Agent, or Firm* — Robinson Intellectual Property Law Office; Eric J. Robinson

(57) ABSTRACT

To provide a highly flexible display device excellent in mass-productivity. A display device includes a flexible substrate, an adhesive layer over the substrate, a resin layer over the adhesive layer, an inorganic insulating layer over the resin layer, a transistor over the inorganic insulating layer, and a display element electrically connected to the transistor. The transistor includes an oxide semiconductor in a channel formation region. The resin layer includes sulfur.

26 Claims, 15 Drawing Sheets

(51) Int. Cl.
*H01L 51/52* (2006.01)
*H01L 51/56* (2006.01)
*H01L 29/786* (2006.01)

(52) U.S. Cl.
CPC ...... *H01L 27/3276* (2013.01); *H01L 51/0097* (2013.01); *H01L 51/5237* (2013.01); *H01L 51/56* (2013.01); *H01L 29/7869* (2013.01); *H01L 2227/323* (2013.01); *H01L 2227/326* (2013.01); *H01L 2251/5338* (2013.01)

(58) Field of Classification Search
CPC ............. H01L 27/3262; H01L 27/3258; H01L 2227/326; H01L 29/7869; H01L 2251/5338; H01L 2227/323
See application file for complete search history.

(56) References Cited

U.S. PATENT DOCUMENTS

| | | | |
|---|---|---|---|
| 7,833,871 | B2 | 11/2010 | Kawakami et al. |
| 8,043,936 | B2 | 10/2011 | Eguchi et al. |
| 8,048,770 | B2 | 11/2011 | Eguchi et al. |
| 8,048,777 | B2 | 11/2011 | Eguchi et al. |
| 8,123,896 | B2 | 2/2012 | Watanabe et al. |
| 8,237,166 | B2 | 8/2012 | Kumomi et al. |
| 8,299,553 | B2 | 10/2012 | Kawakami et al. |
| 8,367,440 | B2 | 2/2013 | Takayama et al. |
| 8,415,208 | B2 | 4/2013 | Takayama et al. |
| 8,629,522 | B2 | 1/2014 | Kawakami et al. |
| 8,698,156 | B2 | 4/2014 | Watanabe et al. |
| 9,088,006 | B2 | 7/2015 | Yamazaki et al. |
| 9,437,831 | B2 | 9/2016 | Yamazaki et al. |
| 9,559,316 | B2 | 1/2017 | Yamazaki et al. |
| 9,559,317 | B2 | 1/2017 | Yamazaki et al. |
| 9,627,648 | B2 | 4/2017 | Yamazaki et al. |
| 2004/0209442 | A1 | 10/2004 | Takakuwa et al. |
| 2008/0042168 | A1 | 2/2008 | Watanabe et al. |
| 2009/0023251 | A1 | 1/2009 | Eguchi et al. |
| 2009/0315457 | A1 | 12/2009 | Furukawa et al. |
| 2012/0045861 | A1 | 2/2012 | Eguchi et al. |
| 2012/0228617 | A1 | 9/2012 | Ko et al. |
| 2013/0168681 | A1* | 7/2013 | Suzuki .................. H01L 23/544 257/59 |
| 2013/0214324 | A1 | 8/2013 | Takayama et al. |
| 2014/0113440 | A1 | 4/2014 | Tanaka et al. |
| 2014/0213071 | A1 | 7/2014 | Kawakami et al. |
| 2014/0220745 | A1 | 8/2014 | Watanabe et al. |
| 2014/0234664 | A1 | 8/2014 | Yasumoto et al. |
| 2014/0339517 | A1 | 11/2014 | Park et al. |
| 2014/0346473 | A1 | 11/2014 | Park et al. |
| 2015/0303408 | A1 | 10/2015 | Lee et al. |
| 2017/0133450 | A1 | 5/2017 | Yamazaki et al. |
| 2017/0294462 | A1 | 10/2017 | Yamazaki et al. |

FOREIGN PATENT DOCUMENTS

| | | |
|---|---|---|
| JP | 2015-072361 A | 4/2015 |
| JP | 2015-223823 A | 12/2015 |

OTHER PUBLICATIONS

Yoon.J et al., "World 1st Large Size 18-inch Flexible OLED Display and the Key Technologies", SID Digest '15 : SID International Symposium Digest of Technical Papers, Jun. 2, 2015, pp. 962-965.

Ko.M et al., "Late-News Paper: Joule Heating Induced Lift-off Technology for Large Area Flexible AMOLED Displays", SID Digest '11 : SID International Symposium Digest of Technical Papers, 2011, vol. 42, No. 1, pp. 118-120.

Hong.S et al., "Development of Commercial Flexible AMOLEDs", SID Digest '14 : SID International Symposium Digest of Technical Papers, Jun. 1, 2014, vol. 45, pp. 334-337.

* cited by examiner

FIG. 15A    before separation
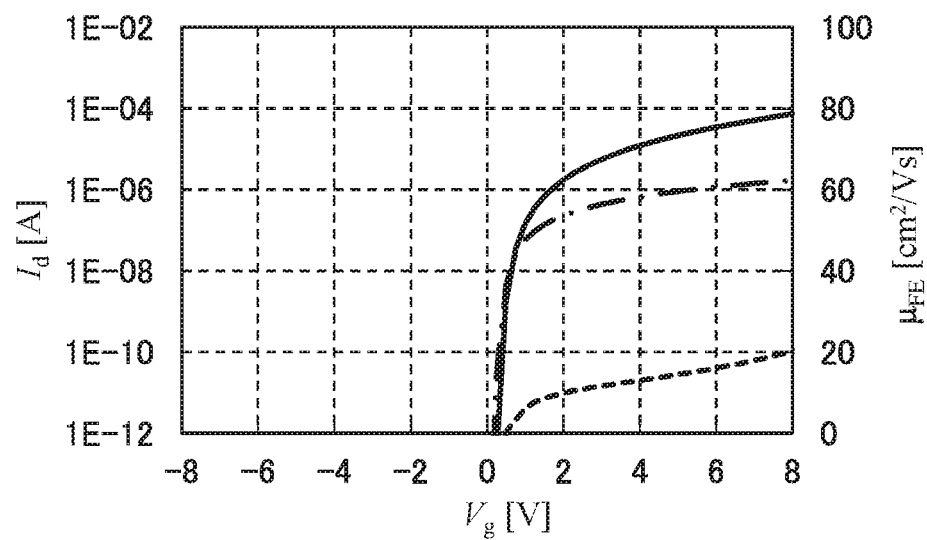
FIG. 15B    after separation
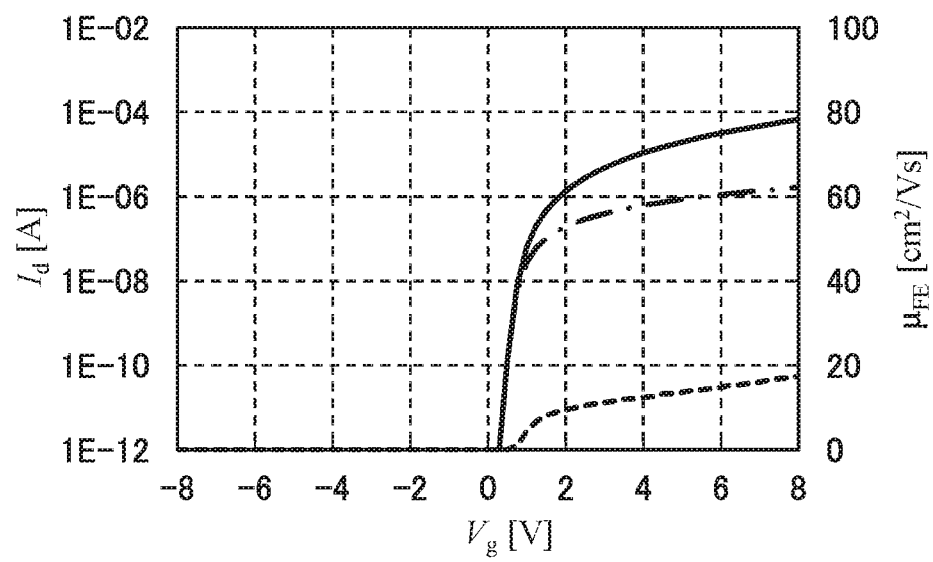

DISPLAY DEVICE AND ELECTRONIC DEVICE

BACKGROUND OF THE INVENTION

1. Field of the Invention

One embodiment of the present invention relates to a display device or an electronic device including the display device.

Note that one embodiment of the present invention is not limited to the above technical field. Examples of the technical field of one embodiment of the present invention include a semiconductor device, a display device, a liquid crystal display device, a light-emitting device, a lighting device, a power storage device, a memory device, a method for driving any of them, and a method for manufacturing any of them.

2. Description of the Related Art

Display devices including, as display elements, electroluminescent (EL) elements or liquid crystal elements are known. In addition, light-emitting devices including light-emitting elements such as light-emitting diodes (LEDs) or display devices including display elements (e.g., an electronic paper) that perform display by an electrophoretic method or other methods can be given as examples.

In a basic structure of an EL element, a layer containing a light-emitting material (an EL layer) is interposed between a pair of electrodes. By applying a voltage between the pair of electrodes of this element, light emission from the light-emitting material can be obtained. A display device including such an organic EL element can be thin and lightweight and have high contrast and low power consumption.

Patent Document 1 discloses a flexible light-emitting device using an EL element.

REFERENCE

Patent Document

[Patent Document 1] Japanese Published Patent Application No. 2014-197522

SUMMARY OF THE INVENTION

A flexible device, typified by a flexible display, can be obtained by providing a semiconductor element such as a transistor and a display element over a flexible substrate (film). However, flexible substrates have lower heat resistance than glass substrates or the like. When semiconductor elements or the like are directly formed on flexible substrates, the electrical characteristics and reliability of the semiconductor elements are difficult to improve in some cases.

Thus, a method described in Patent Document 1 in which a semiconductor element, a light-emitting element, or the like formed over a glass substrate over which a separation layer is formed is separated and transferred to a flexible substrate has been developed. In this method, the formation temperature of the semiconductor element can be increased; thus, a highly reliable flexible device can be manufactured.

An object of one embodiment of the present invention is to provide a display device with excellent flexibility. An object of one embodiment of the present invention is to provide a display device excellent in mass-productivity. An object of one embodiment of the present invention is to provide a display device with high reliability. An object of one embodiment of the present invention is to provide a novel display device.

Note that the description of the above objects does not disturb the existence of other objects. Note that one embodiment of the present invention does not necessarily achieve all the objects. Objects other than the above objects can be derived from the description of the specification, the drawings, the claims, and the like.

One embodiment of the present invention is a display device including a flexible substrate, an adhesive layer over the substrate, a first resin layer over the adhesive layer, an inorganic insulating layer over the first resin layer, a transistor over the inorganic insulating layer, and a display element electrically connected to the transistor. The transistor includes an oxide semiconductor in a channel formation region. The first resin layer includes sulfur.

One embodiment of the present invention is a display device including a flexible substrate, an adhesive layer over the substrate, a first resin layer over the adhesive layer, an inorganic insulating layer over the first resin layer, a transistor over the inorganic insulating layer, and a display element electrically connected to the transistor. The transistor includes an oxide semiconductor in a channel formation region. The first resin layer includes sulfur and nitrogen. In energy dispersive X-ray spectroscopy (EDX), the intensity of sulfur of the first resin layer is higher than the intensity of the nitrogen of the first resin layer.

In each of the above-described structures, it is preferable that the first resin layer include a first compound and the first compound include a sulfonyl group. It is preferable that the first compound include one of or both a quinone diazide skeleton and an indenecarbonyl skeleton. It is preferable that the first compound have a function of absorbing light.

In each of the above-described structures, it is preferable that the first resin layer include a second compound and the second compound include an imide skeleton.

In each of the above-described structures, it is preferable that the first resin layer have a thickness greater than or equal to 0.1 µm and less than or equal to 3 µm.

In each of the above-described structures, it is preferable that a second resin layer be provided over the transistor and the second resin layer include sulfur. It is preferable that a third resin layer be provided over the display element and the third resin layer include sulfur.

The category of one embodiment of the present invention includes not only a display device but also an electronic device including a display device. Therefore, a display device in this specification refers to an image display device. One embodiment of the present invention is the following modules in its category: a module in which a connector such as a flexible printed circuit (FPC) or a tape carrier package (TCP) is attached to a display device; a module having a TCP provided with a printed wiring board at the end thereof; and a module having an integrated circuit (IC) directly mounted on a display device by a chip on glass (COG) method.

One embodiment of the present invention can provide a display device with excellent flexibility. One embodiment of the present invention can provide a display device excellent in mass-productivity. One embodiment of the present invention can provide a display device with high reliability. One embodiment of the present invention can provide a novel display device.

Note that the description of these effects does not disturb the existence of other effects. One embodiment of the

BRIEF DESCRIPTION OF THE DRAWINGS

FIGS. 15A and 15B show the measurement results of the electrical characteristics of a transistor of Example.

DETAILED DESCRIPTION OF THE INVENTION

Figure 1A:
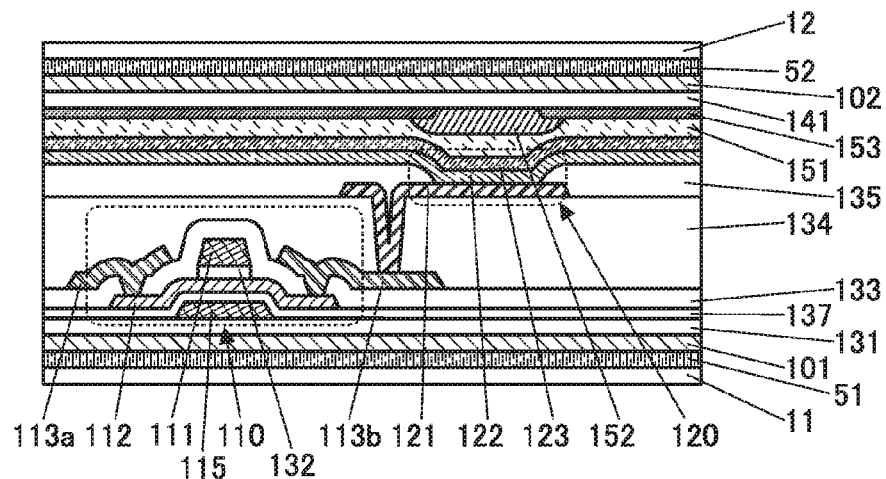
FIG. 1A is a cross-sectional view of a structure of a display device of one embodiment of the present invention.

Embodiments of the present invention will be described below with reference to the drawings. However, the present invention is not limited to the following description, and the mode and details can be variously changed unless departing from the scope and spirit of the present invention. Accordingly, the present invention should not be interpreted as being limited to the content of the embodiments below.

Note that the position, the size, the range, or the like of each structure illustrated in the drawings and the like are not accurately represented in some cases for easy understanding. Therefore, the disclosed invention is not necessarily limited to the position, size, range, or the like as disclosed in the drawings and the like.

In each of the diagrams, independent blocks show elements, which are classified according to their functions. However, it may be practically difficult to completely separate the elements according to their functions; in some cases, one element can involve a plurality of functions.

Note that the ordinal numbers such as "first", "second", and the like in this specification and the like are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

In the description of modes of the present invention in this specification and the like with reference to the drawings, the same components in different diagrams are commonly denoted by the same reference numeral in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, a display device of one embodiment of the present invention and a method for manufacturing the display device will be described with reference to FIG. 1A to FIG. 7C.

One embodiment of the present invention is a flexible display device. In this embodiment, an example in which a flexible display device includes a transistor and a light-emitting element is described, but one embodiment of the present invention is not limited thereto. A semiconductor element different from the transistor and a display element different from the light-emitting element may be included.

<Structure Example of Display Device>

First, a structure of the display device of one embodiment of the present invention will be described with reference to FIG. 1A.

FIG. 1A is a schematic cross-sectional view of a display device 10 of one embodiment of the present invention.

The display device 10 includes a substrate 11, a resin layer 101, a substrate 12, and a resin layer 102. A transistor 110 and a light-emitting element 120 are provided between the pair of substrates (the substrate 11 and the substrate 12). The resin layer 101 is attached to the substrate 11 with an adhesive layer 51 therebetween, and the resin layer 102 is attached to the substrate 12 with an adhesive layer 52 therebetween.

In addition to the transistor 110 and the light-emitting element 120, an insulating layer 131, an insulating layer 133, an insulating layer 134, an insulating layer 135, an insulating layer 137, and the like are provided over the resin layer 101. An insulating layer 141, a coloring layer 152, a light-blocking layer 153, and the like are provided for the resin layer 102. The substrate 11 to which the resin layer 101 is attached is bonded to the substrate 12 to which the resin layer 102 is attached, with an adhesive layer 151 therebetween. Note that although the coloring layer 152 is provided between the light-emitting element 120 and the substrate 12 in the structure example of the display device 10, the display device of one embodiment of the present invention is not limited thereto.

<<Resin Layer>>

The thickness of each of the resin layer 101 and the resin layer 102 is preferably small; specifically, the thickness is greater than or equal to 0.01 μm and less than 10 μm, preferably greater than or equal to 0.1 μm and less than or equal to 3 μm. By thinly forming the resin layer 101 and the resin layer 102, the cost of manufacturing the display device 10 can be reduced. Furthermore, the display device 10 can be lighter weight and thinner. Moreover, the display device 10 can have higher flexibility. By thinly forming the resin layer 102, absorption of light emitted from the light-emitting element 120 is reduced, so that light can be extracted to the outside with higher efficiency and the power consumption of the display device 10 can be reduced.

The resin layers 101 and 102 can be formed in the following manner, for example. A photocurable resin material with a low viscosity is applied to a support substrate and irradiated with light, whereby a resin layer is formed. At this time, heat treatment may be performed in addition to the light irradiation. Then, a structure is formed over the resin layer. Then, the resin layer and the support substrate are separated from each other, whereby one surface of the resin layer is exposed.

As a method of reducing adhesion between the support substrate and the resin layer to separate the support substrate and the resin layer from each other, laser light irradiation is given, for example. It is preferable that the interface between the support substrate and the resin layer be irradiated with linear laser light by scanning. By the method, the process time of the case of using a large support substrate can be shortened. As the laser light, excimer laser light with a wavelength of 308 nm can be suitably used, for example.

The resin layer 101 and the resin layer 102 are preferably formed using a photosensitive resin material. In the case of using a photosensitive resin material, the resin layers can be easily formed. Furthermore, resin layers with a desired shape can be easily formed. For example, a resin layer having an opening, a resin layer including two or more regions with different thicknesses, and the like can be easily formed.

A photosensitive resin material can be suitably used also for an insulating film that functions as a planarization film or the like. Thus, the resin layer to be used for separation and an insulating film or the like can be formed using the same material or the same apparatus, which reduces the cost of manufacturing the display device.

In the case where a photosensitive resin material is used for the resin layer 101 and the resin layer 102, the resin layer 101 and the resin layer 102 preferably include a compound having a function of absorbing light. Note that the compound having a function of absorbing light is preferably added to the resin material. Using different compounds as the compound having a function of absorbing light and a compound for forming the resin material facilitates material design and can expand the range of choices for materials.

The resin layer 101 and the resin layer 102 preferably have a function of transmitting visible light so that light emitted from the light-emitting element 120 passes therethrough. Accordingly, a compound having a function of absorbing light with a wavelength range of ultraviolet light is preferably used as the compound having a function of absorbing light that is added to the resin layer 101 and the resin layer 102. The wavelength range is 300 nm or more and 450 nm or less, preferably 300 nm or more and 400 nm or less. For the resin layer 101 and the resin layer 102, various resins such as acrylic, polyimide, and silicone (having a siloxane bond) can be used, and polyimide is preferably used because it has high heat resistance and an excellent impurity-blocking property, for example.

The polyimide can be synthesized by, for example, a method in which a polyimide precursor is obtained from tetracarboxylic dianhydride and a diamine compound and imidized by an imidization reaction. In the case of using a dehydration reaction as the imidization reaction, a compound having reactivity with water is preferably added so that water formed by the imidization reaction is removed rapidly. It is preferable that the compound having a function of absorbing light also have reactivity with water.

As the compound having a function of absorbing light and having reactivity with water, a compound having a quinone diazide skeleton having a sulfonyl group is preferably used, for example. A compound having a quinone diazide skeleton can form a carboxylic acid skeleton by absorption of light and reaction with water.

Examples of the compound having a quinone diazide skeleton include a compound in which a first skeleton having a phenol group or an alcohol group and a second skeleton having a quinone diazide sulfonic acid are bonded to each other by an ester. Note that the compound having a quinone diazide skeleton may have an amide bond instead of the ester bond.

Examples of the first skeleton include trihydroxybenzophenone, tetrahydroxybenzophenone, pentahydroxybenzophenone, hexahydroxybenzophenone, and (polyhydroxyphenyl)alkane.

The second skeleton is preferably a skeleton having a function of absorbing ultraviolet light. Examples of such a skeleton include a 1,2-naphthoquinone diazide-4-sulfonic acid skeleton and a 1,2-naphthoquinone diazide-5-sulfonic acid skeleton. A 1,2-naphthoquinone diazide-5-sulfonyl ester compound has an absorption with respect to an i-line (wavelength: 365 nm) and a 1,2-naphthoquinone diazide-4-sulfonyl ester compound has an absorption with respect to a g-line (wavelength: 436 nm). It is possible to select a skeleton to be used as the second skeleton as appropriate depending on a wavelength of light to be used for the irradiation. By using a skeleton having an absorption of light in the wavelength range of ultraviolet light as the second skeleton, the resin layer that transmits light in the wavelength range of visible light can be formed.

A sulfonyl group is a substituent having sulfur. Therefore, a layer including a compound having a sulfonyl group is a layer including sulfur. Sulfur included in the layer can be recognized by EDX, for example. EDX is a method in which a characteristic X-ray produced by irradiating a sample with an electron beam is detected and the X-ray is separated into spectral components to perform elementary analysis.

Figure 1B:
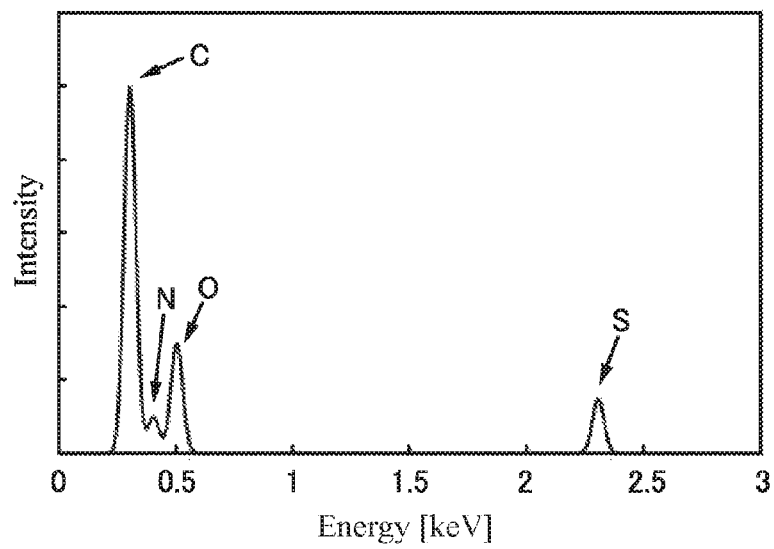
FIG. 1B shows the EDX analysis.

FIG. 1B shows an example of EDX analysis results of the layer including sulfur. As shown in FIG. 1B, elements included in the layer can be detected by EDX analysis. Furthermore, the percentages of elements in the layer can be obtained from the EDX analysis results.

For example, in the case where polyimide is used as the resin layer, carbon, oxygen, and nitrogen are detected because polyimide includes these elements. In the case where a compound including sulfur such as a sulfonyl group is included in the resin layer, sulfur is further detected. In the case where a sulfonyl group is included in the compound having a function of absorbing light, the percentage of the sulfonyl group of the compound having a function of absorbing light in the resin layer can be estimated from the intensity of sulfur that is measured by EDX analysis. In order for the resin layer to absorb light efficiently, the percentage of the sulfonyl group of the compound in the resin layer is preferably high. Furthermore, it is preferable that the compounds included in the resin layer include the quinone diazide skeleton at a higher percentage than the imide skeleton in order to rapidly remove water produced by the imidization reaction. As a result, the percentage of sulfur is preferably higher than the percentage of nitrogen in the case where a quinone diazide sulfonyl skeleton is included in the compound having a function of absorbing light. In summary, in EDX analysis, the intensity of sulfur is preferably higher than the intensity of nitrogen.

As described above, polyimide can be synthesized by the following schemes (a) and (b), for example.

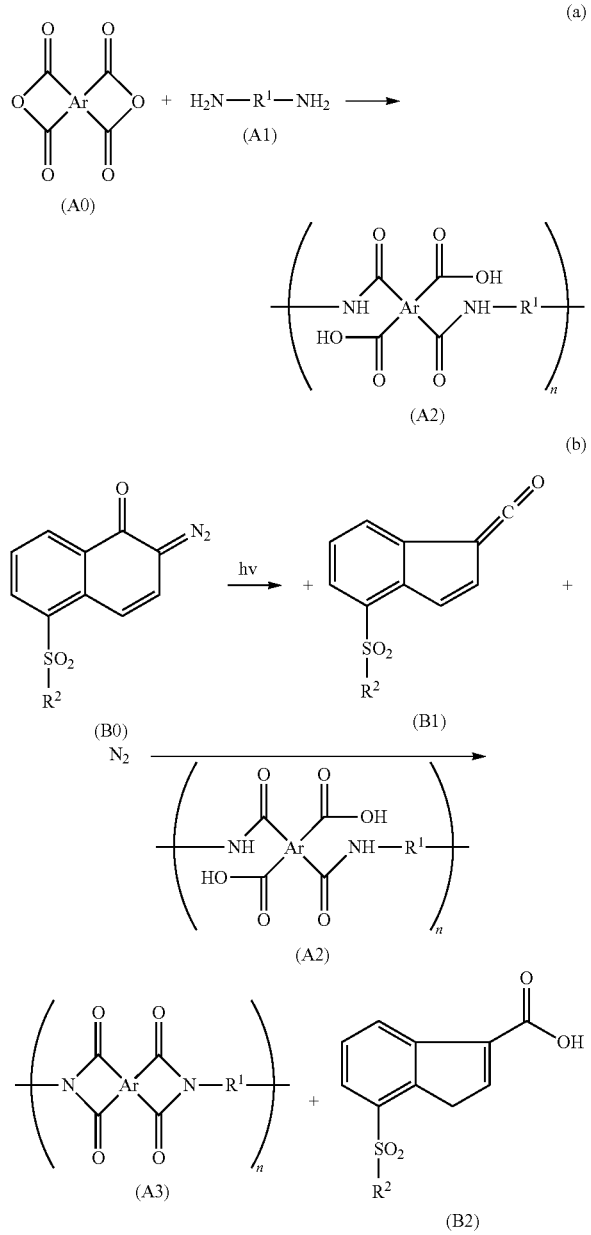

As shown in the scheme (a), a polyimide precursor represented by a general formula (A2) is obtained from tetracarboxylic dianhydride represented by a general formula (A0) and a diamine compound represented by a general formula (A1). Then, as shown in the scheme (b), a compound having a naphthoquinone diazide sulfonyl skeleton represented by a general formula (B0) is added to the polyimide precursor represented by the general formula (A2) and light irradiation is performed to produce a ketene body of a compound having an indenesulfonyl skeleton. The ketene body has a function of easily reacting with water and thus functions as a dehydrator of the polyimide precursor represented by the general formula (A2). Consequently, a polyimide represented by a general formula (A3) and an indene carboxylic acid compound having a sulfonyl group represented by a general formula (B2) can be obtained.

In the schemes (a) and (b), Ar represents a group having a cycloalkylene group having 4 to 40 carbon atoms, an arylene group having 6 to 40 carbon atoms, or the like. $R^1$ represents a group having a cycloalkylene group having 6 to 40 carbon atoms, an arylene group having 6 to 40 carbon atoms, or the like. $R^2$ represents a group having one or a plurality of aryl groups having 6 to 40 carbon atoms or the like, and a structure in which the aryl groups are each bonded to a sulfonyl group by an ester bond is preferable. The Ar, the $R^1$, and the $R^2$ may each have a substituent. As the substituent, an alkyl group having 1 to 20 carbon atoms, an alkoxyl group having 1 to 20 carbon atoms, an aryl group having 6 to 20 carbon atoms, a cycloalkyl group having 6 to 20 carbon atoms, or the like is given, and a fluoroalkyl group, an ester group, a nitro group, a cyano group, or the like may be used.

Note that the resin layer 101 and the resin layer 102 can include a compound that absorbs light and that is not a quinone diazide compound. This can achieve high absorbance. Furthermore, a sensitizer or the like may be included.

<<Transistor>>

The transistor 110 includes a conductive layer 115 that is provided over the insulating layer 131 and functions as a gate electrode, part of the insulating layer 137 that functions as a gate insulating layer, a semiconductor layer 112, an insulating layer 132 that functions as a gate insulating layer, and a conductive layer 111 that functions as a gate electrode. In addition, the insulating layer 133 covering a top surface and a side end portion of the semiconductor layer 112, a side surface of the insulating layer 132, and the conductive layer 111 is included. Furthermore, a conductive layer 113a functioning as one of a source electrode and a drain electrode and a conductive layer 113b functioning as the other of the source electrode and the drain electrode are included. The conductive layers 113a and 113b are electrically connected to the top surface of the semiconductor layer 112 through openings provided in the insulating layer 133.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used, and gate electrodes may be provided over and under a channel.

The transistor 110 is a top-gate transistor. Therefore, the physical distance between the conductive layer 111 and the conductive layer 113a or the conductive layer 113b can be easily increased, so that the parasitic capacitance therebetween can be reduced. Accordingly, the frame frequency of display can be increased. The transistor 110 can favorably be used for a large display device including a display portion with a size of 8 inches or more, for example. Furthermore, the semiconductor layer 112 is sandwiched between the conductive layer 115 and the conductive layer 111 that function as gate electrodes. Thus, an electric field for inducing a channel can be applied to the semiconductor layer 112 effectively. As a result, the current drive capability of the transistor 110 is increased, so that a high on-state current can be obtained. Since the on-state current can be increased, the size of the transistor 110 can be reduced. By supplying a potential for controlling the threshold voltage to one of the conductive layer 111 and the conductive layer 115 and a potential for driving to the other, the threshold voltage of the transistor 110 can be controlled. Furthermore, since the transistor 110 has a structure in which the oxide semiconductor layer 112 is surrounded by the conductive layer 111 and the conductive layer 115, the mechanical strength of the transistor 110 can be increased.

A conductive material including an oxide is preferably used as the conductive layer 111. In that case, a conductive film to be the conductive layer 111 is formed in an atmosphere containing oxygen, whereby oxygen can be supplied to the insulating layer 132. The proportion of an oxygen gas in a film formation gas is preferably higher than or equal to 90% and lower than or equal to 100%. Oxygen supplied to the insulating layer 132 is supplied to the semiconductor layer 112 by heat treatment to be performed later, so that oxygen vacancies in the semiconductor layer 112 can be reduced.

It is particularly preferable to use a low-resistance oxide semiconductor in the conductive layer 111. In this case, the insulating layer 133 is preferably formed using an insulating film that releases hydrogen, for example, a silicon nitride film. Hydrogen is supplied to the conductive layer 111 during the formation of the insulating layer 133 or by heat treatment to be performed after that, whereby the electrical resistance of the conductive layer 111 can be reduced effectively.

Note that although the insulating layer 132 is not present in a portion that does not overlap with the conductive layer 111 in the example, the insulating layer 132 may be provided in a portion covering the top surface and the side end portion of the semiconductor layer 112.

The insulating layer 131 and the insulating layer 141 are preferably highly resistant to moisture. Formation of the transistor 110 and the light-emitting element 120 between a pair of insulating films that are highly resistant to moisture can prevent impurities such as water from entering the transistor and the display element, leading to improved reliability of the display device. Examples of a material of the film highly resistant to moisture include a material containing nitrogen and silicon (e.g., a silicon nitride and a silicon nitride oxide) and a material containing nitrogen and aluminum (e.g., an aluminum nitride). A silicon oxide, a silicon oxynitride, an aluminum oxide, or the like may be used. The permeation amount of water vapor of the insulating film highly resistant to moisture is, for example, lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

The insulating layer 133 and the insulating layer 134 cover the transistor 110. The insulating layer 134 functions as a planarization layer. A material through which impurities such as water and hydrogen do not easily diffuse is preferably used for at least one of the insulating layers 133 and 134. Thus, diffusion of impurities from the outside into the transistor 110 can be inhibited, leading to improved reliability of the display device 10.

The semiconductor layer 112 has a region that functions as a channel formation region of the transistor 110. The semiconductor layer 112 preferably includes an oxide semiconductor. With the use of an oxide semiconductor in the channel formation region of the transistor 110, the maximum process temperature can be lower than that of the case of using low-temperature polysilicon (LTPS), for example.

The transistor including an oxide semiconductor in the channel formation region can be formed at low temperatures, specifically, at 400° C. or lower, 350° C. or lower, or 300° C. or lower. Therefore, the resin layer is not required to have high heat resistance. Thus, the heat resistant temperature of the resin layer can be low, and the range of choices for the materials can be widened. Furthermore, the transistor including an oxide semiconductor does not need a laser crystallization step. Since an oxide semiconductor has a large band gap of 2.5 eV or more and 3.5 eV or less (preferably 3.0 eV or more), an oxide semiconductor absorbs less light than silicon. Accordingly, even when an oxide semiconductor is irradiated with laser light in a separation step, the laser light is less absorbed, so that the electrical characteristics can be less affected. Accordingly, the resin layer can be thinned. The resin layer 101 does not require high heat resistance and can be thinned, so that the cost of manufacturing the display device can be reduced.

Meanwhile, in the case where LTPS is used in a channel formation region of a transistor, the maximum process temperature is higher than or equal to 500° C. or higher than or equal to 550° C., for example; thus, the resin layer requires resistance against heat up to temperatures approximately equal to the maximum process temperature. This extremely limits choices for a material that can be used for the resin layer. Furthermore, the thickness of the resin layer needs to be large (e.g., larger than or equal to 10 μm, or larger than or equal to 20 μm) to reduce damage in a laser crystallization step in forming LTPS. Since silicon has a small band gap of approximately 1.1 eV, absorption of laser light by silicon needs to be reduced when the resin layer that functions as a separation layer is irradiated with laser light to separate the transistor or the like from the support substrate. Also for this reason, the thickness of the resin layer needs to be large. Thus, a special material having a large thickness and high heat resistance is required, which increases the cost of manufacturing the display device.

The heat resistance of the resin layer 101 can be measured by, for example, a weight loss percentage due to heat, specifically, the 5% weight loss temperature. In one embodiment of the present invention, the 5% weight loss temperature of the resin layer is preferably lower than or equal to 450° C., further preferably lower than or equal to 400° C., still further preferably lower than 400° C., yet still further preferably lower than 350° C.

<<Light-Emitting Element>>

The light-emitting element 120 includes a conductive layer 121, an EL layer 122, and a conductive layer 123. The conductive layer 121 has a function of reflecting visible light, and the conductive layer 123 has a function of transmitting visible light. Therefore, the light-emitting element 120 is a light-emitting element having a top-emission structure in which light is extracted to the side opposite to the formation surface side. However, one embodiment of the present invention is not limited to this, and the display device may include a light-emitting element having a bottom-emission structure in which light is extracted to the formation surface side of the light-emitting element or a dual-emission structure in which light is extracted to both of the formation surface side of the light-emitting element and the side opposite to the formation surface side.

The conductive layer 121 is electrically connected to the conductive layer 113b through an opening provided in the insulating layer 134. The insulating layer 135 covers an end portion of the conductive layer 121 and is provided with an opening to expose a top surface of the conductive layer 121. The EL layer 122 and the conductive layer 123 are provided in this order to cover the insulating layer 135 and an exposed portion of the conductive layer 121.

The coloring layer 152 includes a region overlapping with the light-emitting element 120, and the light-blocking layer 153 includes an opening in a region overlapping with the light-emitting element 120. The light-emitting element 120 is preferably formed such that the opening is located in a position overlapping with the transistor, a capacitor, a wiring, or the like, in which case the aperture ratio of the light-emitting element 120 can be increased.

The coloring layer 152 has a function of transmitting light in a specific wavelength range. For example, a color filter for transmitting light in a red, green, blue, or yellow wavelength range can be used. Examples of materials that can be used for the coloring layer 152 include a metal material, a resin material, and a resin material containing a pigment or dye.

Note that the display device of one embodiment of the present invention is not limited to the structure including the coloring layer 152. The display device may have a structure that does not include a coloring layer or a structure that includes a color conversion layer or a layer including a quantum dot.

The light-blocking layer 153 is provided between adjacent coloring layers 152. The light-blocking layer 153 has a function of inhibiting color mixture between adjacent light-emitting elements by blocking light emitted from the adjacent light-emitting elements. The coloring layer 152 is formed such that its end portion overlaps with the light-blocking layer 153, whereby light leakage from the light-emitting element can be reduced. The light-blocking layer 153 can be formed using, for example, a metal material, a resin material containing a pigment or dye, or the like.

One of the conductive layers 121 and 123 functions as an anode, and the other functions as a cathode. The EL layer 122 is a layer containing a light-emitting material. By application of voltage between the conductive layer 121 and the conductive layer 123, holes are injected from the anode to the EL layer 122, and electrons are injected from the cathode to the EL layer 122. The injected holes and electrons are recombined in the EL layer 122 and the light-emitting material contained in the EL layer 122 emits light. Note that the EL layer 122 includes at least a light-emitting layer containing the light-emitting material. In addition to the light-emitting layer, a layer which is capable of lowering a hole- or electron-injection barrier, improving a hole- or electron-transport property, inhibiting a hole- or electron-transport property, or suppressing a quenching phenomenon by an electrode may be included, for example. Note that the layers may be single layers or stacking layers.

The EL layer 122 preferably includes at least one or more light-emitting materials that emit light of violet, blue, blue green, green, yellow green, yellow, yellow orange, orange, and red. An organic compound and an inorganic compound can be used for the EL layer 122. As the organic compound, a low molecular compound and a high molecular compound can be used.

<Modification Examples of Light-Emitting Device>

Next, a structure example different from that of the display device 10 illustrated in FIG. 1A is described below with reference to FIGS. 2A and 2B, FIGS. 3A to 3C, and FIGS. 4A to 4C. In FIGS. 2A and 2B, FIGS. 3A to 3C, and FIGS. 4A to 4C, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

Modification Example 1

Figure 2A:
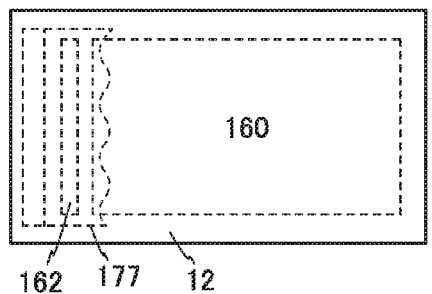
FIGS. 2A and 2B are a top view and a cross-sectional view illustrating a structure of a display device of one embodiment of the present invention.

FIG. 2A is a top view of a display device of one embodiment of the present invention.

A display device 10a shown in FIG. 2A includes a display portion 160 and a driver circuit portion 162. An FPC 177 is attached to the display device 10a.

Figure 2B:
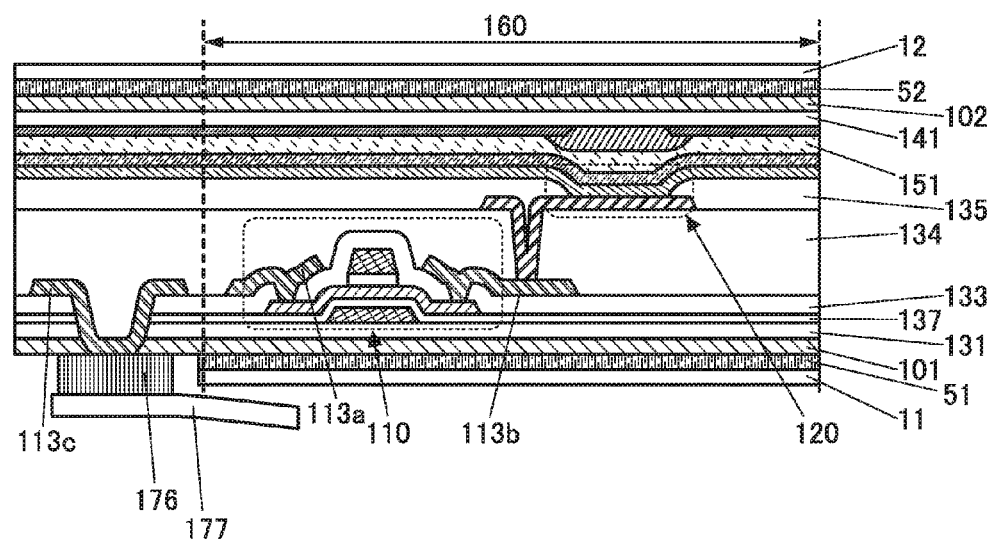

FIG. 2B is a schematic cross-sectional view of a portion where the display portion 160 and the FPC 177 of the display device 10a shown in FIG. 2A are connected to each other.

The display device 10a includes a conductive layer 113c. The conductive layer 113c can be formed using a material and a step that are similar to those used for forming the conductive layer included in the transistor 110. For example, the conductive layer 113c can be formed using a material and a step that are similar to those used for forming the conductive layer 113a and the conductive layer 113b. The conductive layer 113c is electrically connected to an external input terminal through which a signal or a potential from the outside is transmitted to the driver circuit portion 162. In this example, the FPC 177 is provided as the external input terminal. The FPC 177 and the conductive layer 113c are electrically connected to each other through a connector 176.

As the connector 176, any of various anisotropic conductive films (ACF), anisotropic conductive pastes (ACP), and the like can be used.

As described above, the resin layer 101 can be formed using a photosensitive material. Thus, an opening can be easily provided in the resin layer 101, so that the conductive layer 113c and the FPC 177 can be electrically connected to each other through the opening provided in the resin layer 101. Such a structure allows the FPC 177 to be provided on the side opposite to a display surface. Thus, a space for bending the FPC 177 in incorporating a display device in an electronic device can be eliminated, which enables the electronic device to be smaller.

Modification Example 2

Figure 3A:
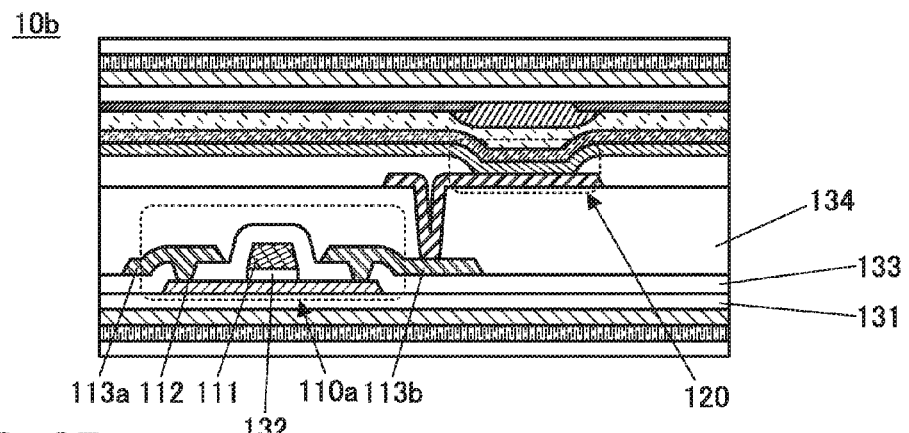
FIGS. 3A to 3C are cross-sectional views each illustrating a structure of a display device of one embodiment of the present invention.
Figure 3B:
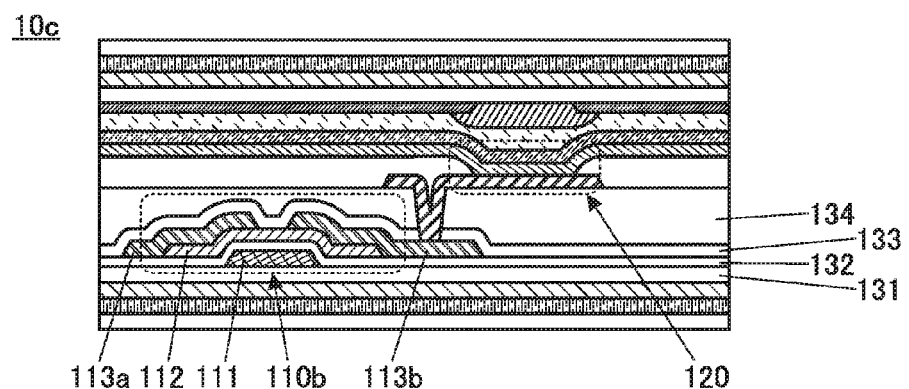
Figure 3C:
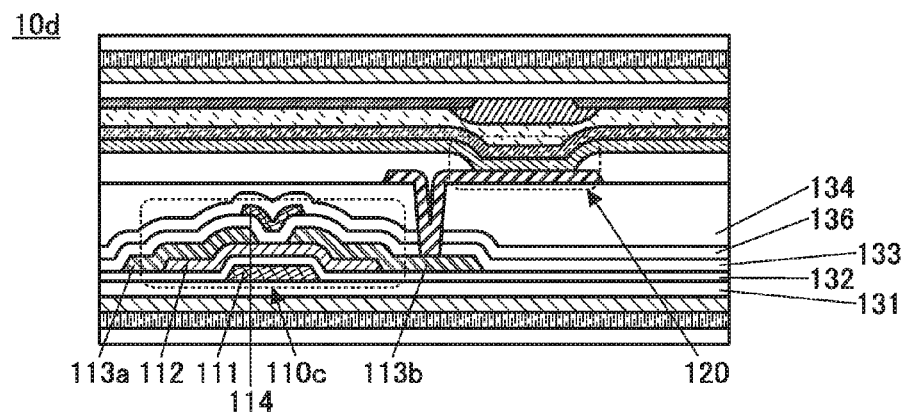

FIGS. 3A to 3C are each a schematic cross-sectional view of a display device of one embodiment of the present invention.

A display device 10b shown in FIG. 3A includes a transistor 110a and the light-emitting element 120. The transistor 110a is a top-gate transistor. The use of a top-gate transistor can reduce parasitic capacitance, leading to an increase in the frame frequency of display. Furthermore, the transistor 110a does not include the conductive layer 115 (see the transistor 110) and can therefore be easily manufactured. Thus, the manufacturing cost of the display device can be reduced.

A display device 10c shown in FIG. 3B includes a transistor 110b and the light-emitting element 120. The transistor 110b is a bottom-gate transistor. The transistor 110b is provided over the insulating layer 131 and includes the conductive layer 111 functioning as a gate electrode, part of the insulating layer 132 functioning as a gate insulating layer, the semiconductor layer 112, the conductive layer 113a functioning as one of a source electrode and a drain electrode, the conductive layer 113b functioning as the other of the source electrode and the drain electrode, and the insulating layer 133 functioning as a protective insulating layer. The transistor 110b, which is a channel-etched transistor, includes an end portion of the conductive layer 113a and an end portion of the conductive layer 113b that are directly connected to the semiconductor layer 112; thus, the distance between the conductive layers 113a and 113b can be reduced. Accordingly, a high-resolution display device with high pixel density can be manufactured.

A display device 10d shown in FIG. 3C includes a transistor 110c and the light-emitting element 120. The transistor 110c is a bottom-gate transistor. The transistor 110c is provided over the insulating layer 131 and includes the conductive layer 111 functioning as a gate electrode, the part of the insulating layer 132 functioning as a gate insulating layer, the semiconductor layer 112, the conductive layer 113a functioning as one of a source electrode and a drain electrode, the conductive layer 113b functioning as the other of the source electrode and the drain electrode, the insulating layer 133 functioning as a gate insulating layer, a conductive layer 114 functioning as a gate electrode, and an insulating layer 136 functioning as a protective insulating layer. The transistor 110c, which is a channel-etched transistor, includes the end portion of the conductive layer 113a and the end portion of the conductive layer 113b that are directly connected to the semiconductor layer 112; thus, the distance between the conductive layers 113a and 113b can be reduced. Furthermore, the semiconductor layer 112 is sandwiched between the conductive layers 111 and 114 functioning as gate electrodes. Accordingly, an electric field for inducing a channel can be applied to the semiconductor layer 112 effectively. Consequently, the current drive capability of the transistor 110c is increased, and high on-state current can be obtained. Since the on-state current can be increased, it is possible to reduce the size of the transistor 110c. Furthermore, since the transistor 110c has a structure in which the oxide semiconductor layer 112 is surrounded by the conductive layer 111 and the conductive layer 114, the mechanical strength of the transistor 110 can be increased.

Modification Example 3

Figure 4A:
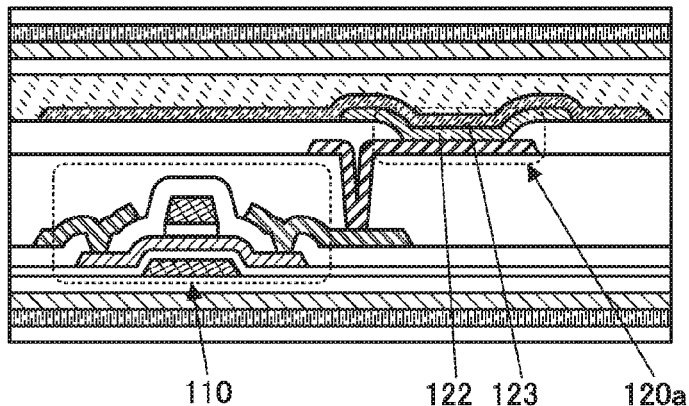
FIGS. 4A to 4C are cross-sectional views each illustrating a structure of a display device of one embodiment of the present invention.
Figure 4B:
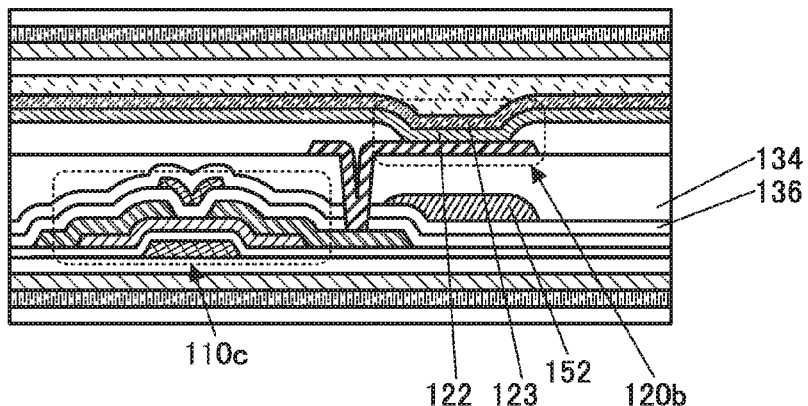
Figure 4C:
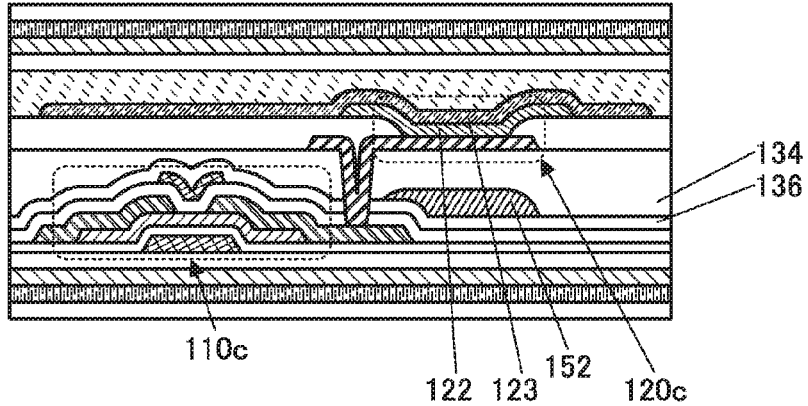

FIGS. 4A to 4C are each a schematic cross-sectional view of a display device of one embodiment of the present invention.

A display device 10e shown in FIG. 4A includes the transistor 110 and a light-emitting element 120a. In the display device 10e, the light-emitting element is formed by a separate coloring method. The method can reduce power consumption in the light-emitting element.

A display device 10f shown in FIG. 4B includes the transistor 110c and a light-emitting element 120b. In the display device 10f, the coloring layer 152 is sandwiched between the insulating layer 136 and the insulating layer 134. The transistor, the light-emitting element, and the coloring layer are formed over the resin layer 101; thus, the accuracy of positional alignment of the light-emitting element and the coloring layer can be increased. The light-emitting element may be formed by a separate coloring method as in a display device 10g shown in FIG. 4C. The light-emitting element formed by a separate coloring method can consume less power.

As described above, an oxide semiconductor is used in the transistor in the display device of one embodiment of the present invention, so that the manufacturing process of the transistor can be performed at low temperatures. In addition, the resin layer can have a small thickness and low heat resistance. Thus, the display device can be lightweight and thin. Moreover, the display device can have higher flexibility. Furthermore, warpage of the display device that is to be caused by a thick resin layer can be suppressed in some cases.

<Manufacturing Method 1 of Display Device>

An example of a method for manufacturing the display device 10 illustrated in FIG. 1A is described below with reference to FIGS. 5A to 5E, FIGS. 6A to 6D, FIGS. 7A to 7C, and FIGS. 8A and 8B.

Note that the thin films included in the display device (i.e., the insulating film, a semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As an example of the thermal CVD method, a metal organic chemical vapor deposition (MOCVD) method may be used.

The thin films included in the display device (i.e., the insulating film, the semiconductor film, the conductive film, and the like) can be formed by a method such as spin coating, dipping, spray coating, ink-jetting, dispensing, screen printing, or offset printing, or with a doctor knife, a slit coater, a roll coater, a curtain coater, or a knife coater.

When the thin films included in the display device are processed, a photolithography method or the like can be used. Alternatively, island-shaped thin films may be formed by a film formation method using a blocking mask. Alternatively, the thin films may be processed by a nano-imprinting method, a sandblasting method, a lift-off method, or the like. As the photolithography method, there are a method in which a resist mask is formed over a thin film to be processed, the thin film is processed by etching or the like, and the resist mask is removed and a method in which a photosensitive thin film is formed, and the photosensitive thin film is exposed to light and developed to be processed in a desirable shape.

As light used for exposure in a photolithography method, for example, light with an i-line (wavelength: 365 nm), light with an h-line (wavelength: 405 nm), light with a g-line (wavelength: 436 nm), or light in which the i-line, the h-line, and the g-line are mixed can be used. Alternatively, ultraviolet light, KrF laser light, ArF laser light, or the like can be used. The exposure may be performed by liquid immersion exposure technique. As the light for the exposure, extreme ultra-violet light (EUV) or X-rays may also be used. Instead of the light for the exposure, an electron beam can be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, dry etching, wet etching, a sandblast method, and the like can be used.

<<Formation of Resin Layer>>

First, a support substrate 61 is prepared. For the support substrate 61, a material having stiffness high enough to facilitate the transfer and having resistance to heat applied in the manufacturing process can be used. For example, a material such as glass, quartz, ceramics, sapphire, a resin, a semiconductor, a metal, or an alloy can be used. Examples of glass include alkali-free glass, barium borosilicate glass, aluminoborosilicate glass, and the like.

Figure 5A:
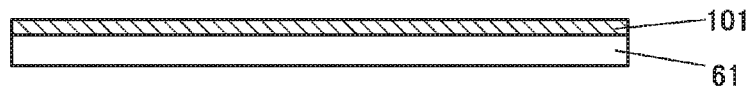
FIGS. 5A to 5E are cross-sectional views illustrating a method for manufacturing a display device of one embodiment of the present invention.

Next, the resin layer 101 is formed over the support substrate 61 (FIG. 5A).

First, a material to be the resin layer 101 is applied on the support substrate 61. For the application, a spin coating method is preferred because the resin layer 101 can be thinly and uniformly formed over a large substrate.

Alternatively, the material can be formed by dipping, spray coating, ink-jetting, dispensing, screen printing, or offset printing, or with a doctor knife, a slit coater, a roll coater, a curtain coater, or a knife coater, for example.

The material is preferably photosensitive. The material preferably contains a solvent for adjusting the viscosity.

The material preferably contains a resin such as an acrylic resin, an epoxy resin, a polyamide resin, a polyimide amide resin, a siloxane resin, a benzocyclobutene-based resin, and a phenol resin; or a precursor of any of these resins or a polymerizable monomer that becomes any of these resins after polymerization. That is, the formed resin layer 101 contains any of these resins.

The viscosity of the material used for the application is greater than or equal to 5 cP and less than 500 cP, preferably greater than or equal to 5 cP and less than 100 cP, more preferably greater than or equal to 10 cP and less than or equal to 50 cP. The lower the viscosity of the material is, the easier the application becomes. Furthermore, the lower the viscosity of the material is, the more the entry of bubbles can be suppressed, leading to a film with good quality. Lower viscosity of the material allows application for a thin and uniform film, whereby the resin layer 101 can be thinner.

Then, the support substrate 61 is irradiated with light (subjected to light irradiation) to cure the applied material, whereby the resin layer 101 is formed. Heat treatment may be performed in addition to the light irradiation. By heating, a solvent in the material can be removed. The temperature at this heating is preferably higher than or equal to the maximum temperature in the manufacturing process of the transistor 110 to be performed later. The heating is performed at a temperature of, for example, higher than or equal to 300° C. and lower than or equal to 600° C., preferably higher than or equal to 350° C. and lower than or equal to 550° C., more preferably higher than or equal to 400° C. and lower than or equal to 500° C., and is typically 450° C. For the formation of the resin layer 101, heating at such a temperature is performed in a state where the surface of the resin layer 101 is exposed, so that a gas that can be released from the resin layer 101 can be removed. Thus, release of the gas in the process for forming the transistor 110 can be suppressed.

The thickness of the resin layer 101 is preferably greater than or equal to 0.01 μm and less than 10 μm, more preferably greater than or equal to 0.1 μm and less than or equal to 3 μm, and more preferably greater than or equal to 0.5 μm and less than or equal to 1 μm. The use of a low viscosity solvent facilitates the formation of the thin and uniform resin layer 101.

The thermal expansion coefficient of the resin layer 101 is preferably greater than or equal to 0.1 ppm/° C. and less than or equal to 20 ppm/° C., and more preferably greater than or equal to 0.1 ppm/° C. and less than or equal to 10 ppm/° C. The lower the thermal expansion coefficient of the resin layer 101 is, the more the breakage of the transistor or the like by stress caused by expansion or contraction due to heating can be suppressed.

In the case where a photosensitive material is used for the resin layer 101, part of the resin layer 101 can be removed by a photolithography method. Specifically, after the material is applied, heat treatment (also referred to as pre-baking) for removing the solvent is performed, and then light exposure is performed. Next, development is performed, whereby an unnecessary portion can be removed. After that, heat treatment (also referred to as post-baking) is preferably performed. The second heat treatment may be performed at the above-described temperature.

An opening portion is formed in the resin layer 101 in the above manner, so that a structure described below can be obtained. For example, by disposing a conductive layer to cover the opening portion, an electrode part of which is exposed on the rear surface side (also referred to as a rear electrode or a through electrode) can be formed after a separation process to be described later. The electrode can be used as an external connection terminal. Furthermore, for example, a structure in which the resin layer 101 is not provided in a marker portion for bonding of two display panels can improve the alignment accuracy.

<<Formation of Insulating Layer 131>>

Figure 5B:
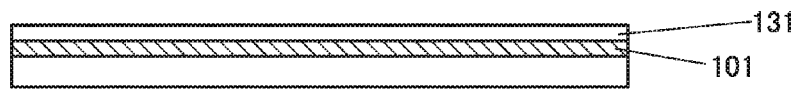

The insulating layer 131 is formed over the resin layer 101 (FIG. 5B).

The insulating layer 131 can be used as a barrier layer that prevents impurities contained in the resin layer 101 from diffusing into a transistor or a light-emitting element to be formed later. Thus, it is preferable to use a material with a high barrier property.

For the insulating layer 131, an inorganic insulating film such as a silicon nitride film, a silicon oxynitride film, a silicon oxide film, a silicon nitride oxide film, an aluminum oxide film, or an aluminum nitride film can be used, for example. A stack including two or more of the above insulating films may also be used. In particular, a structure in which a silicon nitride film and a silicon oxide film are stacked on the resin layer 101 side is preferably employed.

In the case where the resin layer 101 has an uneven surface, the insulating layer 131 preferably covers the unevenness. The insulating layer 131 may function as a planarization layer that fills the unevenness. It is preferable to use a stack including an organic insulating material and an inorganic insulating material for the insulating layer 131, for example. The organic insulating material can be a resin such as an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin.

The insulating layer 131 is preferably formed at a temperature higher than or equal to room temperature and lower than or equal to 400° C., more preferably higher than or equal to 100° C. and lower than or equal to 350° C., more preferably higher than or equal to 150° C. and lower than or equal to 300° C.

<<Formation of Transistor>>

Figure 5C:
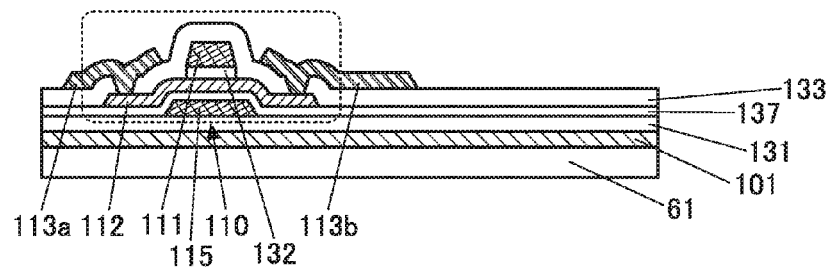

Next, as illustrated in FIG. 5C, the transistor 110 is formed over the insulating layer 131. Here, an example where a top-gate transistor is formed as an example of the transistor 110 will be described.

First, the conductive layer 115 is formed over the insulating layer 131. The conductive layer 115 can be formed in the following manner: the conductive film is formed, a resist mask is formed, the conductive film is etched, and the resist mask is removed.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Furthermore, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, or ITO containing silicon may be used. Furthermore, a semiconductor such as an oxide semiconductor or polycrystalline silicon whose resistance is lowered by containing an impurity element or the like, or silicide such as nickel silicide may be used. A film including graphene may be used as well. The film including graphene can be formed, for example, by reducing a film containing graphene oxide. Furthermore, a semiconductor such as an oxide semiconductor containing an impurity element may be used. Furthermore, a conductive paste of silver, carbon, copper, or the like or a conductive polymer such as a polythiophene may be used. A conductive paste is preferable because it is inexpensive. A conductive polymer is preferable because it is easily applied.

Then, the insulating layer 137 is formed. For the insulating layer 137, the description of the inorganic insulating film that can be used as the insulating layer 131 can be referred to.

Then, the semiconductor layer 112 is formed. The semiconductor layer 112 can be formed in the following manner: the semiconductor film is formed, a resist mask is formed, the semiconductor film is etched, and the resist mask is removed.

The semiconductor film is formed at a substrate temperature higher than or equal to room temperature and lower than or equal to 300° C., preferably higher than or equal to room temperature and lower than or equal to 220° C., more preferably higher than or equal to room temperature and lower than or equal to 200° C., more preferably higher than or equal to room temperature and lower than or equal to 170° C. Here, "the substrate temperature for the film formation is room temperature" means that the substrate is not heated intentionally, and includes the case where the substrate temperature is higher than the room temperature because the substrate receives energy in the film formation. The room temperature has a range of, for example, higher than or equal to 10° C. and lower than or equal to 30° C., and is typically 25° C.

An oxide semiconductor is preferably used for the semiconductor film. In particular, an oxide semiconductor having a wider band gap than silicon is preferably used. A semiconductor material having a wider band gap and a lower carrier density than silicon is preferably used because off-state current of the transistor can be reduced.

It is preferable to use a material having a band gap of greater than or equal to 2.5 eV, preferably greater than or equal to 2.8 eV, more preferably greater than or equal to 3.0 eV as the oxide semiconductor. With use of such an oxide semiconductor, in light (e.g., laser light) irradiation in the separation process to be described later, the light transmits the semiconductor film and thus electrical characteristics of the transistor are less likely to be adversely affected.

In particular, the semiconductor film used for one embodiment of the present invention is preferably formed under an atmosphere that contains one or both of an inert gas (e.g., Ar) and an oxygen gas by a sputtering method in a state where the substrate is heated.

The substrate temperature for the film formation is preferably higher than or equal to room temperature and lower than or equal to 200° C., more preferably higher than or equal to room temperature and lower than or equal to 170° C. A high substrate temperature results in a larger number of crystal parts with orientation, which electrically stabilize the semiconductor film. A transistor including such a semiconductor film can have high electrical stability. Alternatively, film formation at a low substrate temperature or film formation without intentional substrate heating can make a semiconductor film have a low proportion of crystal parts with orientation and high carrier mobility. A transistor including such a semiconductor film can have high field-effect mobility.

The oxygen flow rate ratio (partial pressure of oxygen) during the film formation is preferably higher than or equal to 0% and lower than 100%, more preferably higher than or equal to 0% and lower than or equal to 50%, more preferably higher than or equal to 0% and lower than or equal to 33%, and more preferably higher than or equal to 0% and lower than or equal to 15%. A low oxygen flow rate can result in a semiconductor film with high carrier mobility, leading to a transistor with high field-effect mobility.

Accordingly, setting the substrate temperature and the oxygen flow rate during the deposition within the above ranges can result in a semiconductor film containing both crystal parts with orientation and crystal parts with no orientation. Furthermore, the proportions of crystal parts with orientation and crystal parts with no orientation can be adjusted by optimization of the substrate temperature and the oxygen flow rate within the above ranges.

An oxide target that can be used for forming the semiconductor film is not limited to an In—Ga—Zn-based oxide; for example, an In-M-Zn-based oxide (M is Al, Y, or Sn) can be used.

When a semiconductor film containing crystal parts is formed using a sputtering target containing a polycrystalline oxide having a plurality of crystal grains, a semiconductor film with crystallinity can be obtained easier than the case of using a sputtering target not containing a polycrystalline oxide.

In particular, a transistor including a semiconductor film that contains both crystal parts with orientation in a thickness direction (also referred to as a film surface direction, or a direction perpendicular to a formation surface or surface of a film) and randomly aligned crystal parts with no such orientation can have more stable electrical characteristics and a smaller channel length, for example. On the other hand, a transistor including a semiconductor film that contains only crystal parts with no orientation can have high field-effect mobility. Note that as described below, a reduction in oxygen vacancies in an oxide semiconductor can achieve a transistor with high field-effect mobility and high stability of electrical characteristics.

In the case of using the oxide semiconductor film as described above, high-temperature heat treatment and a laser crystallization process which are needed for LTPS are unnecessary; thus, the semiconductor layer 112 can be formed at a significantly low temperature. Therefore, the resin layer 101 can be formed thin.

Then, the insulating layer 132 and the conductive layer 111 are formed. The insulating layer 132 and the conductive layer 111 can be formed in the following manner: the insulating film and the conductive film are formed, a resist mask is formed, the insulating film and the conductive film are etched, and the resist mask is removed. For the insulating layer 132, the description of the inorganic insulating film that can be used as the insulating layer 131 can be referred to. For the conductive layer 111, the description of the conductive film that can be used as the conductive layer 115 can be referred to.

Then, the insulating layer 133 that covers the semiconductor layer 112, the insulating layer 132, and the conductive layer 111 is formed. For the insulating layer 133, the description of the inorganic insulating film that can be used as the insulating layer 131 can be referred to. Then, the openings reaching the semiconductor layer 112 are formed.

The openings can be formed in the following manner: a resist mask is formed, the insulating layer 133 is etched, and the resist mask is removed.

Then, the conductive layer 113a and the conductive layer 113b are formed. The conductive layers 113a and 113b can be formed in the following manner: the conductive film is formed, a resist mask is formed, the conductive film is etched, and the resist mask is removed.

In the above-described manner, the transistor 110 can be manufactured over the resin layer 101 having flexibility. The transistor 110 contains an oxide semiconductor in the semiconductor layer 112 where a channel is formed. In the transistor 110, the conductive layer 115 functions as a gate electrode, the part of the insulating layer 137 functions as a gate insulating layer, the insulating layer 132 functions as a gate insulating layer, and the conductive layer 111 functions as a gate electrode. The semiconductor layer 112 includes a channel region and a low-resistance region. The channel region overlaps with the conductive layer 111 with the insulating layer 132 therebetween. The low-resistance region includes a portion connected to the conductive layer 113a and a portion connected to the conductive layer 113b. The conductive layer 113a and the conductive layer 113b each function as one of a source and a drain.

If the resin layer 101 and the support substrate 61 are separated from each other at this stage by a method described later, a flexible device including no display element can be fabricated. Forming the transistor 110 or forming a capacitor, a resistor, a wiring, and the like in addition to the transistor 110, and separating the resin layer 101 and the supporting substrate 61 from each other can provide a flexible device including a semiconductor circuit, for example.

<<Formation of Insulating Layer 134>>

The insulating layer 134 is formed over the transistor 110. The display element is formed on the insulating layer 134 in a later step; thus, the insulating layer 134 preferably functions as a planarization layer. For the insulating layer 134, the description of the organic insulating film or the inorganic insulating film that can be used for the insulating layer 131 can be referred to.

For the insulating layer 134, as well as for the resin layer 101, a photosensitive resin material is preferably used. In particular, the same material is preferably used for the insulating layer 134 and the resin layer 101. In that case, the same material and the same apparatus can be used for forming the insulating layer 134 and the resin layer 101.

The thickness of the insulating layer 134, as well as the thickness of the resin layer 101, is preferably greater than or equal to 0.01 μm and less than 10 μm, more preferably greater than or equal to 0.1 μm and less than or equal to 3 μm, and more preferably greater than or equal to 0.5 μm and less than or equal to 1 μm. The use of a low viscosity solvent facilitates the formation of the thin and uniform insulating layer 134.

<<Formation of Light-Emitting Element 120>>

Next, the opening that reaches the conductive layer 113b and the like is formed in the insulating layer 134.

After that, the conductive layer 121 is formed. Part of the conductive layer 121 functions as a pixel electrode. The conductive layer 121 can be formed in the following manner: the conductive film is formed, a resist mask is formed, the conductive film is etched, and the resist mask is removed.

Figure 5D:
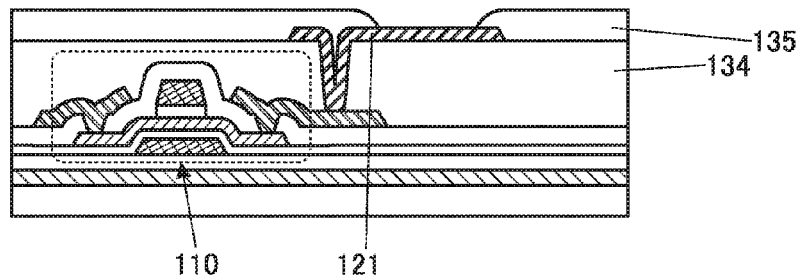

Then, the insulating layer 135 that covers the end portion of the conductive layer 121 is formed as illustrated in FIG. 5D. For the insulating layer 135, the description of the organic insulating film or the inorganic insulating film that can be used for the insulating layer 131 can be referred to.

For the insulating layer 135, as well as for the resin layer 101, a photosensitive resin material is preferably used. In particular, the same material is preferably used for the insulating layer 135 and the resin layer 101. In that case, the same material and the same apparatus can be used for forming the insulating layer 135 and the resin layer 101.

The thickness of the insulating layer 135, as well as the thickness of the resin layer 101, is preferably greater than or equal to 0.01 μm and less than 10 μm, more preferably greater than or equal to 0.1 μm and less than or equal to 3 μm, and more preferably greater than or equal to 0.5 μm and less than or equal to 1 μm. The use of a low viscosity solvent facilitates the formation of the thin and uniform insulating layer 135.

Figure 5E:
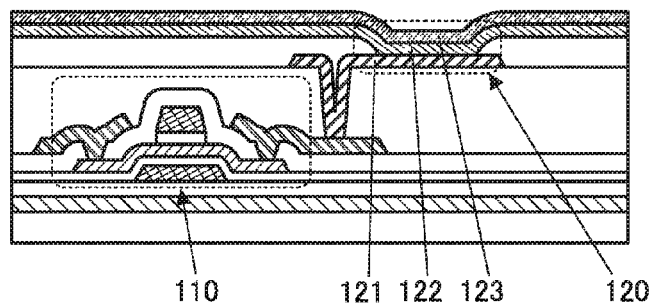

Next, the EL layer 122 and the conductive layer 123 are formed as illustrated in FIG. 5E.

The EL layer 122 can be formed by an evaporation method, a coating method, a printing method, a discharge method, or the like. In the case where the EL layer 122 is formed for each individual pixel, an evaporation method using a shadow mask such as a metal mask, an ink-jet method, or the like can be used. In the case of sharing the EL layer 122 by some pixels, an evaporation method not using a metal mask can be used. Here, an example where the EL layer 122 is formed by an evaporation method without using a metal mask is described.

The conductive layer 123 can be formed by an evaporation method, a sputtering method, or the like.

In the above manner, the light-emitting element 120 can be completed. In the light-emitting element 120, the conductive layer 121 part of which functions as a pixel electrode, the EL layer 122, and the conductive layer 123 part of which functions as a common electrode are stacked.

<<Formation of Resin Layer 102>>

A support substrate 62 is prepared. For the support substrate 62, the description of the support substrate 61 can be referred to.

Figure 6A:
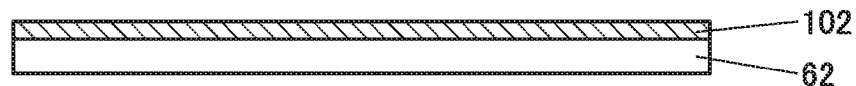
FIGS. 6A to 6D are cross-sectional views illustrating a method of manufacturing a display device of one embodiment of the present invention.

Next, the resin layer 102 is formed over the support substrate 62 (FIG. 6A). The description of the method and the material for forming the resin layer 101 can be referred to for those for forming the resin layer 102.

<<Formation of Insulating Layer 141>>

Figure 6B:
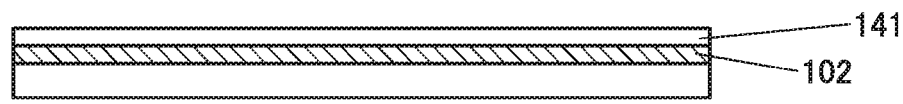

The insulating layer 141 is formed over the resin layer 102 (FIG. 6B). The insulating layer 141 can be used as a barrier layer that prevents impurities contained in the resin layer 102 from diffusing into a transistor or a light-emitting element to be formed later. Thus, it is preferable to use a material with a high barrier property.

The description of the method and the material for forming the insulating layer 131 can be referred to for those for forming the insulating layer 141.

<<Formation of Light-Blocking Layer and Coloring Layer>>

Figure 6C:
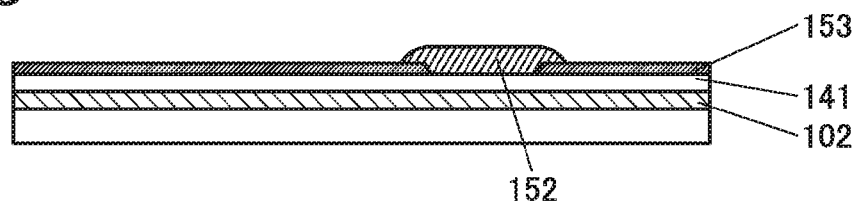

Then, the light-blocking layer 153 and the coloring layer 152 are formed over the insulating layer 141 (FIG. 6C).

For the light-blocking layer 153, a metal material or a resin material can be used. In the case where a metal material is employed, the light-blocking layer 153 can be formed in such a manner that the conductive film is formed and an unnecessary portion is removed by a photolithography method or the like. In the case where a photosensitive resin material containing pigment or dye is used, the light-blocking layer 153 can be formed by a photolithography method or the like.

For the coloring layer 152, a photosensitive material can be used. The coloring layer 152 formed with a photosensitive material can be processed into an island-like shape by a photolithography method or the like.

Through the above steps, the insulating layer 141, the light-blocking layer 153, and the coloring layer 152 can be formed over the resin layer 102. Note that the resin-layer-101-side manufacturing process and the resin-layer-102-side manufacturing process can be independently performed, and the order is not particularly limited. Alternatively, these two processes may be performed in parallel.

<<Bonding>>

Figure 6D:
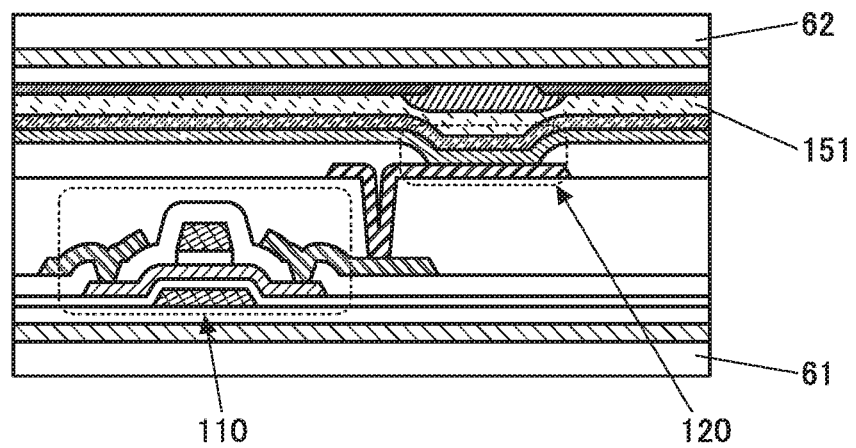

Then, as illustrated in FIG. 6D, the support substrate 61 and the support substrate 62 are bonded to each other with use of the adhesive layer 151. Then, the adhesive layer 151 is cured. Thus, the light-emitting element 120 can be sealed with the adhesive layer 151.

A curable material is preferably used for the adhesive layer 151. For example, a photocurable resin, a reactive curable resin, or a thermosetting resin can be used. In particular, a resin material without a solvent is preferably used.

Through the above-described process, the transistor 110 and the light-emitting element 120 can be manufactured. At the point of FIG. 6D, the transistor 110 and the light-emitting element 120 are sandwiched between the support substrate 61 and the support substrate 62.

<<Separation of Support Substrate 61>>

Figure 7A:
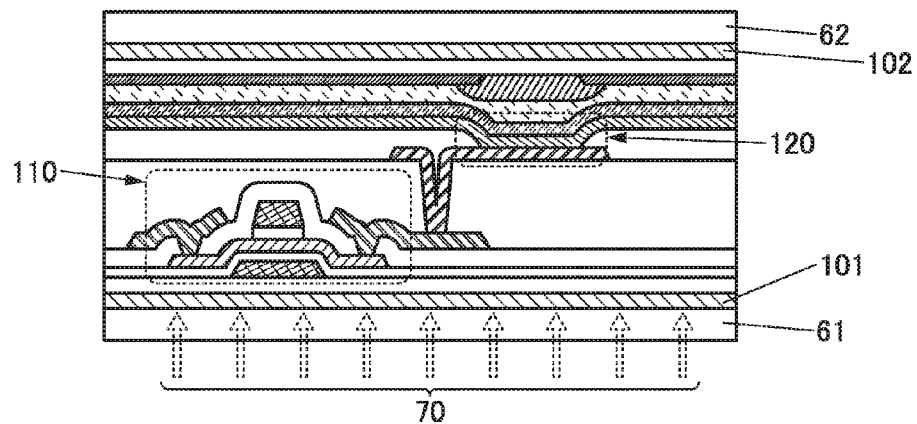
FIGS. 7A to 7C are cross-sectional views illustrating a method for manufacturing a display device of one embodiment of the present invention.

Then, as shown in FIG. 7A, the resin layer 101 is irradiated with light 70 through the support substrate 61 from the support substrate 61 side in which the transistor 110 and the light-emitting element 120 are provided.

Laser light is suitable for the light 70. In particular, linear laser light is preferable.

Note that a flash lamp or the like may be used as long as the resin layer 101 can be irradiated with light whose energy is as high as that of laser light.

As the light 70, light having a wavelength by which at least part of the light 70 is transmitted through the support substrate 61 and absorbed by the resin layer 101 is selected. In particular, it is preferable to use light with a wavelength range from visible light to ultraviolet light as the light 70. For example, light having a wavelength of greater than or equal to 200 nm and less than or equal to 400 nm, preferably greater than or equal to 250 nm and less than or equal to 350 nm, is used. In particular, an excimer laser having a wavelength of 308 nm is preferably used because the productivity is increased. The excimer laser is preferable because the excimer laser can be used also for laser crystallization of LTPS, so that the existing LTPS production line device can be used and newly capital investment is not necessary. Alternatively, a solid-state UV laser (also referred to as a semiconductor UV laser), such as a UV laser having a wavelength of 355 nm which is the third harmonic of an Nd:YAG laser, may be used. A pulsed laser such as a picosecond laser may be used.

In the case where a linear laser light is used as the light 70, the light 70 is scanned and a region to be separated is entirely irradiated with the light 70 by relatively moving the support substrate 62 and a light source. At this step, when irradiation is performed on the entire surface where the resin layer 101 is provided, the resin layer 101 can be separated entirely and it is not necessary to cut the periphery portion of the support substrate 62 by scribing or the like in a subsequent separation step. Alternatively, it is preferable that the peripheral portion of the region where the resin layer 101 is provided have a region not irradiated with the light 70 because separation of the resin layer 101 and the support substrate 61 can be suppressed at the irradiation.

By the irradiation with the light 70, the vicinity of the surface of the resin layer 101 on the support substrate 61 side or part of the inside of the resin layer 101 is improved and the adhesion between the support substrate 61 and the resin layer 101 is reduced. In contrast, the region not irradiated with the light 70 still has high adhesion.

Figure 7B:
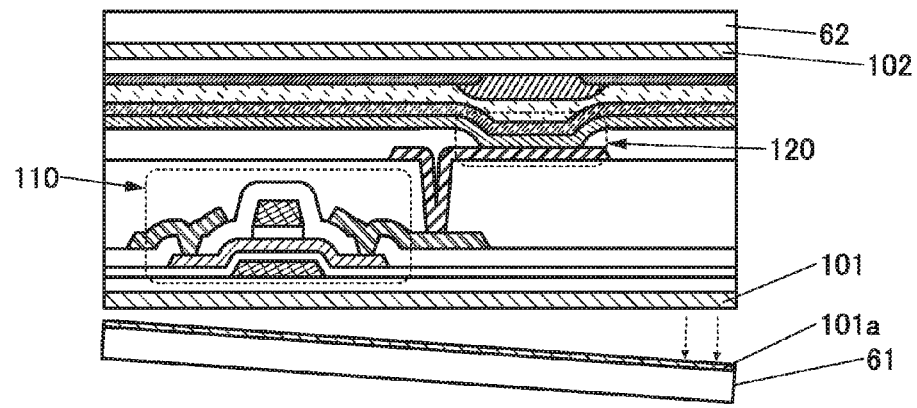

Next, the support substrate 61 and the resin layer 101 are separated (FIG. 7B).

Separation can be performed by applying pulling force in the perpendicular direction to the support substrate 61 while the support substrate 62 is fixed to a stage. For example, the support substrate 61 can be separated by adsorbing part of the top surface of the support substrate 61 and pulling it upward. The stage may have any structure as long as the support substrate 62 can be fixed. For example, the stage may have an adsorption mechanism capable of vacuum adsorption, electrostatic adsorption, or the like or a mechanism physically fastening the support substrate 62.

Alternatively, separation may be performed by pressing a drum-shaped member with an adhesive surface against the surface of the support substrate 61 and rotating the member. At this time, the stage may be moved in the separating direction.

In the case where the region not irradiated with the light 70 is provided in the peripheral portion of the resin layer 101, a notch may be formed in part of the resin layer 101 irradiated with the light 70 to function as a trigger for separation. The notch can be formed with a sharp edged tool or a needle-like member or can be formed by cutting the support substrate 61 and the resin layer 101 at the same time by scribing or the like.

FIG. 7B illustrates an example in which a resin layer 101*a* which is part of the resin layer 101 remains on the support substrate 61 side. Depending on the condition of the irradiation with the light 70, separation (fracture) occurs inside the resin layer 101 and the resin layer 101*a* remains in this manner in some cases. Also in the case where part of the surface of the resin layer 101 is melted, part of the resin layer 101*a* sometimes remains on the support substrate 61 side as well. In the case where separation is performed at the interface between the support substrate 61 and the resin layer 101, the resin layer 101*a* sometimes does not remain on the support substrate 61 side.

The thickness of the resin layer 101*a* remaining on the support substrate 61 side can be less than or equal to 100 nm, specifically approximately greater than or equal to 40 nm and less than or equal to 70 nm. The support substrate 61 from which the remaining resin layer 101*a* is removed can be reused. In the case where glass is used for the support substrate 61 and a polyimide resin is used for the resin layer 101, for example, the resin layer 101*a* can be removed with fuming nitric acid or the like.

<<Bonding of Substrate 11>>

Figure 7C:
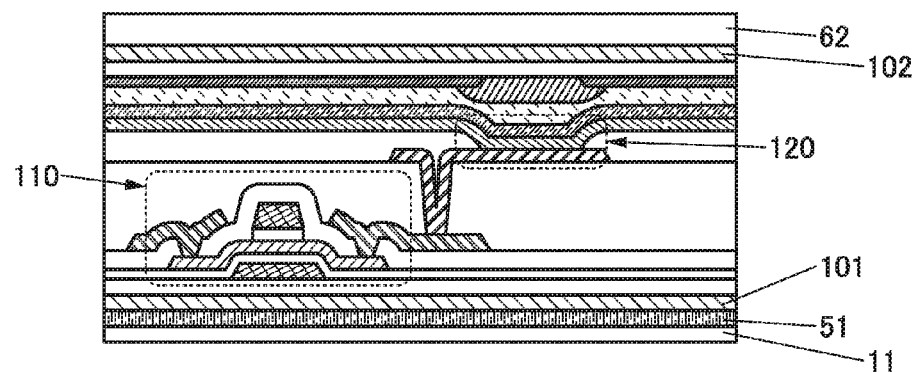

Then, as illustrated in FIG. 7C, the resin layer 101 and the substrate 11 are bonded to each other with the adhesive layer 51.

The description of the adhesive layer 151 can be referred to for the adhesive layer 51.

When a resin material is used for the substrate 11 and the substrate 12 to be described later, the display device can be reduced in weight as compared with the case where glass or the like is used for the substrate 11 and the substrate 12 with the same thicknesses. A material which is thin enough to have flexibility is preferably used because the display device can be further reduced in weight. Furthermore, when a resin material is used, the display device can have higher impact resistance; thus, a non-breakable display device can be obtained.

Since the substrate 11 is located on the side opposite to the viewing side, the substrate 11 does not necessarily transmit visible light. Therefore, a metal material can also be used. A metal material, which has high thermal conductivity, can suppress a local temperature rise in the display device because it can easily conduct heat to the whole substrate.

<<Separation of Support Substrate 62>>

Figure 8A:
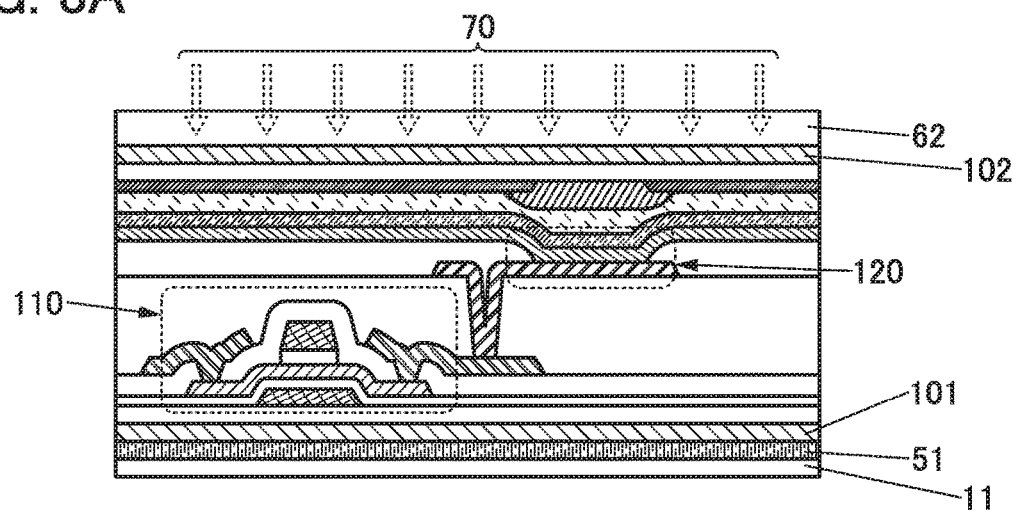
FIGS. 8A and 8B are cross-sectional views illustrating a method of manufacturing a display device of one embodiment of the present invention.
Figure 8B:
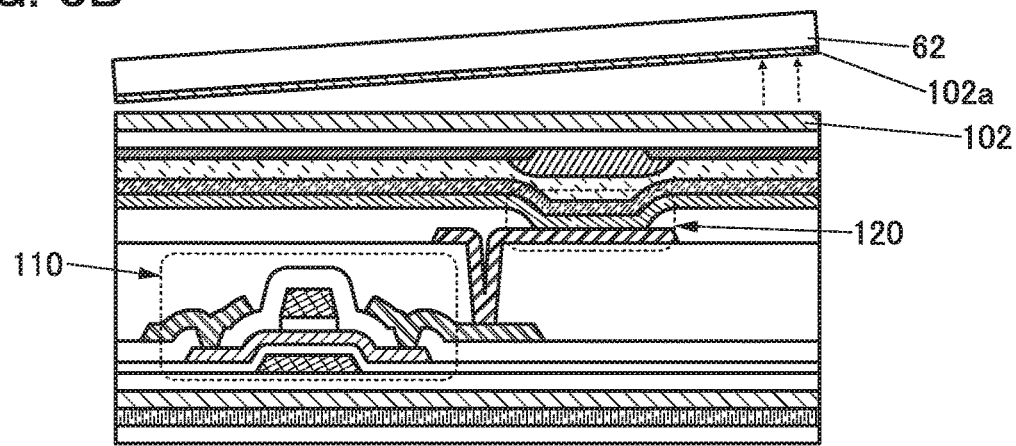

Then, as illustrated in FIG. 8A, the resin layer 102 is irradiated with the light 70 through the support substrate 62 from the support substrate 62 side. After that, as illustrated in FIG. 8B, the support substrate 62 and the resin layer 102 are separated.

The above description can be referred to for the irradiation method of the light 70.

The separation can be performed in a state where the substrate 11 is fixed to a stage or the like. The above description can be referred to for the separation method.

<<Bonding of Substrate 12>>

Then, the resin layer 102 and the substrate 12 are bonded to each other with the adhesive layer 52 (see FIG. 1A).

The description of the adhesive layer 151 can be referred to for the adhesive layer 52.

Since the substrate 12 is located on the viewing side, a material transmitting visible light can be used.

Through the above process, the display device 10 illustrated in FIG. 1A can be manufactured.

<Manufacturing Method 2 of Display Device>

An example of a method of manufacturing the display device 10a illustrated in FIG. 2B is described below with reference to FIGS. 9A to 9E and FIGS. 10A to 10C. In FIGS. 9A to 9E and FIGS. 10A to 10C, a portion having a function similar to that in FIGS. 5A to 5E, FIGS. 6A to 6D, FIGS. 7A to 7C, and FIGS. 8A and 8B is represented by the same hatch pattern as in FIGS. 5A to 5E, FIGS. 6A to 6D, FIGS. 7A to 7C, and FIGS. 8A and 8B and not especially denoted by a reference numeral in some cases. In addition, common reference numerals are used for portions having similar functions, and a detailed description of the portions is omitted in some cases.

Figure 9A:
FIGS. 9A to 9E are cross-sectional views illustrating a method of manufacturing a display device of one embodiment of the present invention.

First, the resin layer 101 is formed over the support substrate 61 using a material having photosensitivity (FIG. 9A).

Specifically, a film of the material having photosensitivity is formed to a thickness of greater than or equal to 0.1 μm and less than or equal to 3 μm.

Next, a solvent is removed by heat treatment and then light exposure is performed using a photomask. After that, development is performed to process the film into a desired shape (FIG. 9B).

Figure 9B:
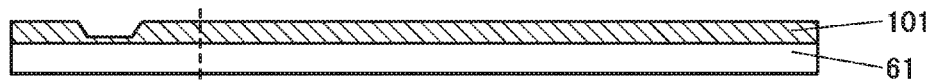

FIG. 9B illustrates an example in which a first region and a second region which is thinner than the first region are provided in the resin layer 101. Alternatively, an opening may be provided in the resin layer 101.

Next, the film processed into a desired shape is heated, whereby the resin layer 101 is formed. It is particularly preferable that the film be heated at a temperature higher than or equal to the formation temperature of each layer formed over the resin layer 101. For example, in the case where the formation temperature of the transistor is below 350° C., the film to be the resin layer 101 is preferably heated at a temperature higher than or equal to 350° C. and lower than or equal to 450° C., further preferably higher than or equal to 350° C. and lower than or equal to 400° C., still further preferably higher than or equal to 350° C. and lower than 400° C., and yet still further preferably higher than or equal to 350° C. and lower than 375° C. Thus, a gas released from the resin layer 101 in the manufacturing process of the transistor can be significantly reduced.

Next, the insulating layer 131 is formed over the resin layer 101. Then, the transistor 110 is formed over the insulating layer 131.

Figure 9C:
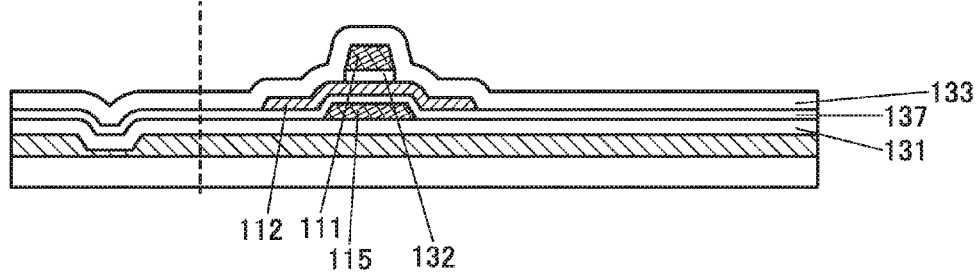

Specifically, first, the conductive layer 115, the insulating layer 137, the semiconductor layer 112, the insulating layer 132, the conductive layer 111, and the insulating layer 133 are formed over the insulating layer 131 (FIG. 9C).

Figure 9D:
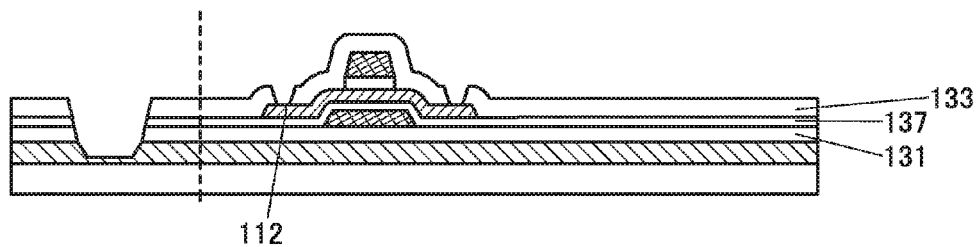

Then, an opening is formed in a portion overlapping with the thin region (the second region) of the resin layer 101 in each of the insulating layer 131, the insulating layer 137, and the insulating layer 133 (FIG. 9D). The opening in a plurality of layers may be formed at a time or may be formed in each layer. In the insulating layer 133, the openings reaching the semiconductor layer 112 are also formed.

Figure 9E:
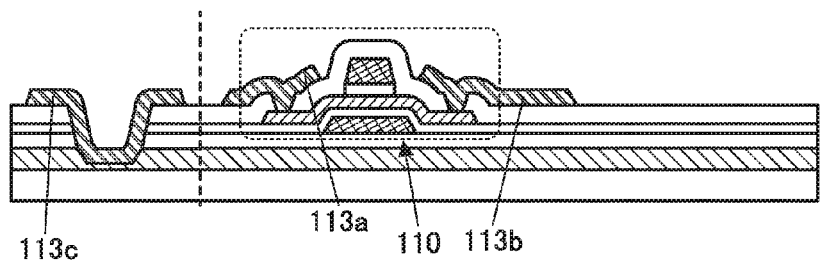

Then, the conductive layer 113a, the conductive layer 113b, and the conductive layer 113c are formed (FIG. 9E). The conductive layers 113a, 113b, and 113c can be formed in the following manner: the conductive film is formed, a resist mask is formed, the conductive film is etched, and the resist mask is removed.

Next, components from the insulating layer 134 to the light-emitting element 120 are formed over the insulating layer 133. For these steps, the manufacturing method 1 can be referred to.

In a manner similar to that in the manufacturing method 1, the resin layer 102, the insulating layer 141, the coloring layer 152, and the light-blocking layer 153 are formed over the support substrate 62.

Figure 10A:
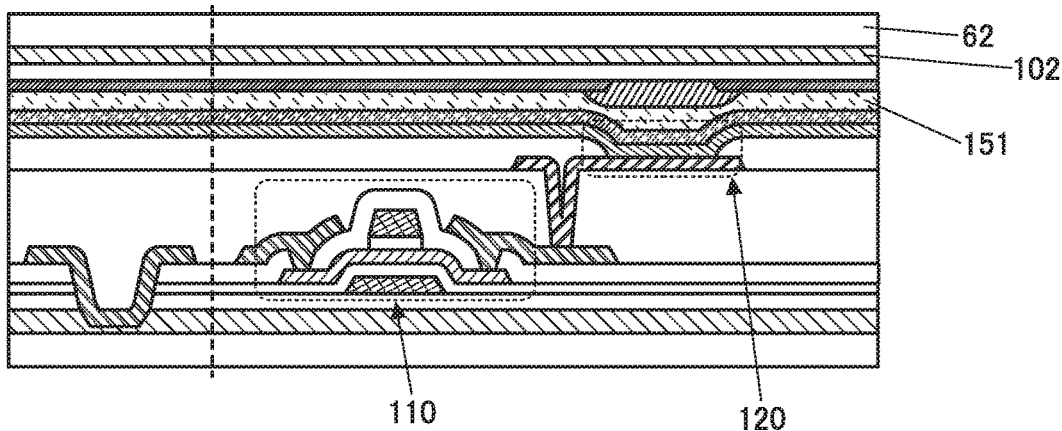
FIGS. 10A to 10C are cross-sectional views illustrating a method of manufacturing a display device of one embodiment of the present invention.

Then, a surface of the support substrate 61 on which the resin layer 101 and the like are formed and a surface of the support substrate 62 on which the resin layer 102 and the like are formed are attached to each other with the adhesive layer 151. FIG. 10A is a schematic cross-sectional view illustrating this state.

Then, the resin layer 101 is irradiated with laser light through the support substrate 61. Here, an example in which the support substrate 61 is separated ahead of the support substrate 62 is shown.

Figure 10B:
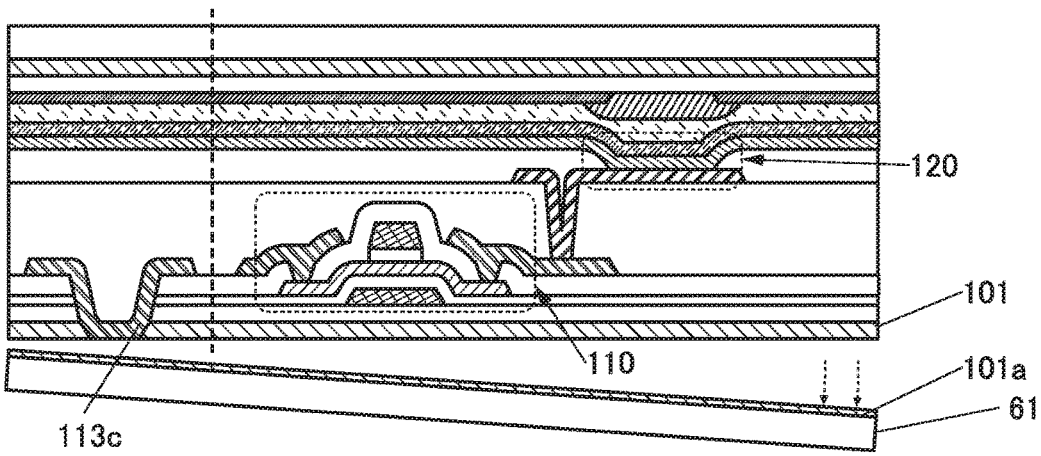

Then, the support substrate 61 and the resin layer 101 are separated from each other (FIG. 10B). FIG. 10B illustrates an example in which separation occurs in the resin layer 101. Part of the resin layer (the resin layer 101a) remains over the support substrate 61. The thickness of the resin layer 101 remaining on the insulating layer 131 side is reduced as compared with that in FIG. 10A. The second region (a region thinner than other regions) of the resin layer 101 is entirely positioned on the support substrate 61 side. Therefore, the conductive layer 113c is exposed.

In the case where the resin layer 101 remains over the conductive layer 113c, the resin layer 101 is preferably removed by ashing or the like. Alternatively, in the case where the conductive layer 113c can be electrically connected to the FPC without removing the resin layer 101, for example, the resin layer 101 is not necessarily removed.

Figure 10C:
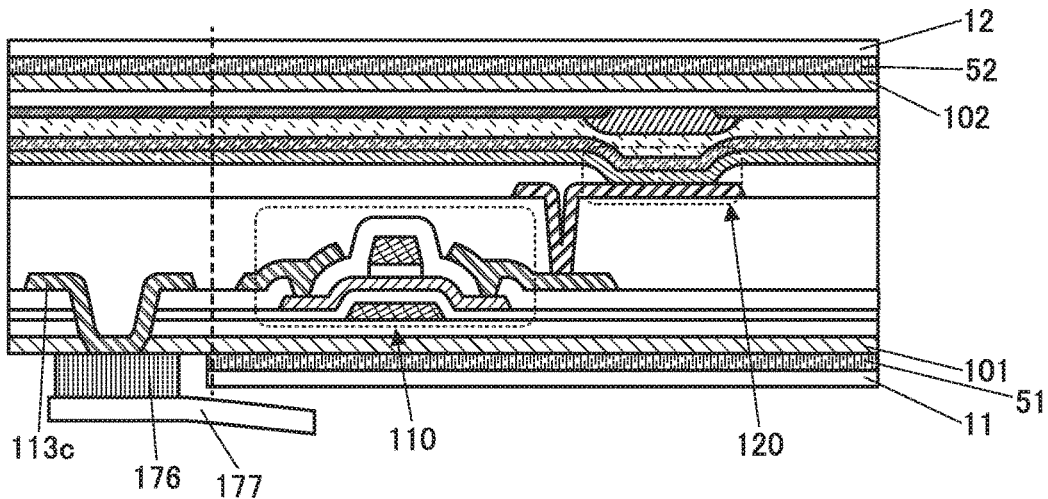

Then, the exposed resin layer 101 and the substrate 11 are attached to each other with the adhesive layer 51 (FIG. 10C). Note that the substrate 11 and the adhesive layer 51 are provided in a position that does not overlap with the conductive layer 113c.

Then, the resin layer 102 is irradiated with laser light through the support substrate 62. Then, the support substrate 62 and the resin layer 102 are separated from each other.

Then, the exposed resin layer 102 and the substrate 12 are attached to each other with the adhesive layer 52 (FIG. 10C).

Then, the conductive layer 113c and the FPC 177 are electrically connected to each other through the connector 176 (FIG. 10C).

As the connector 176, any of various anisotropic conductive films, anisotropic conductive pastes, and the like can be used.

In this manufacturing method, an example using a top-emission light-emitting element is shown. In the case where the conductive layer 113c is exposed from the substrate 12 side and electrically connected to the FPC 177, the display region cannot overlap with the FPC 177 because the substrate 12 is on the display surface side, and thus a region of the display device that overlaps with the FPC 177 is limited. In contrast, in one embodiment of the present invention, the conductive layer 113c can be exposed from the side opposite to the display surface with the use of the photosensitive material for the resin layer 101. Therefore, the FPC 177 can be provided to overlap with the display region and the space of an electronic device can be saved.

This embodiment can be combined with any of other embodiments as appropriate.

Embodiment 2

In this embodiment, a display module and an electronic device each including the display device of one embodiment of the present invention will be described with reference to FIG. 11 and FIGS. 12A to 12G.

<Display Module>

Figure 11:
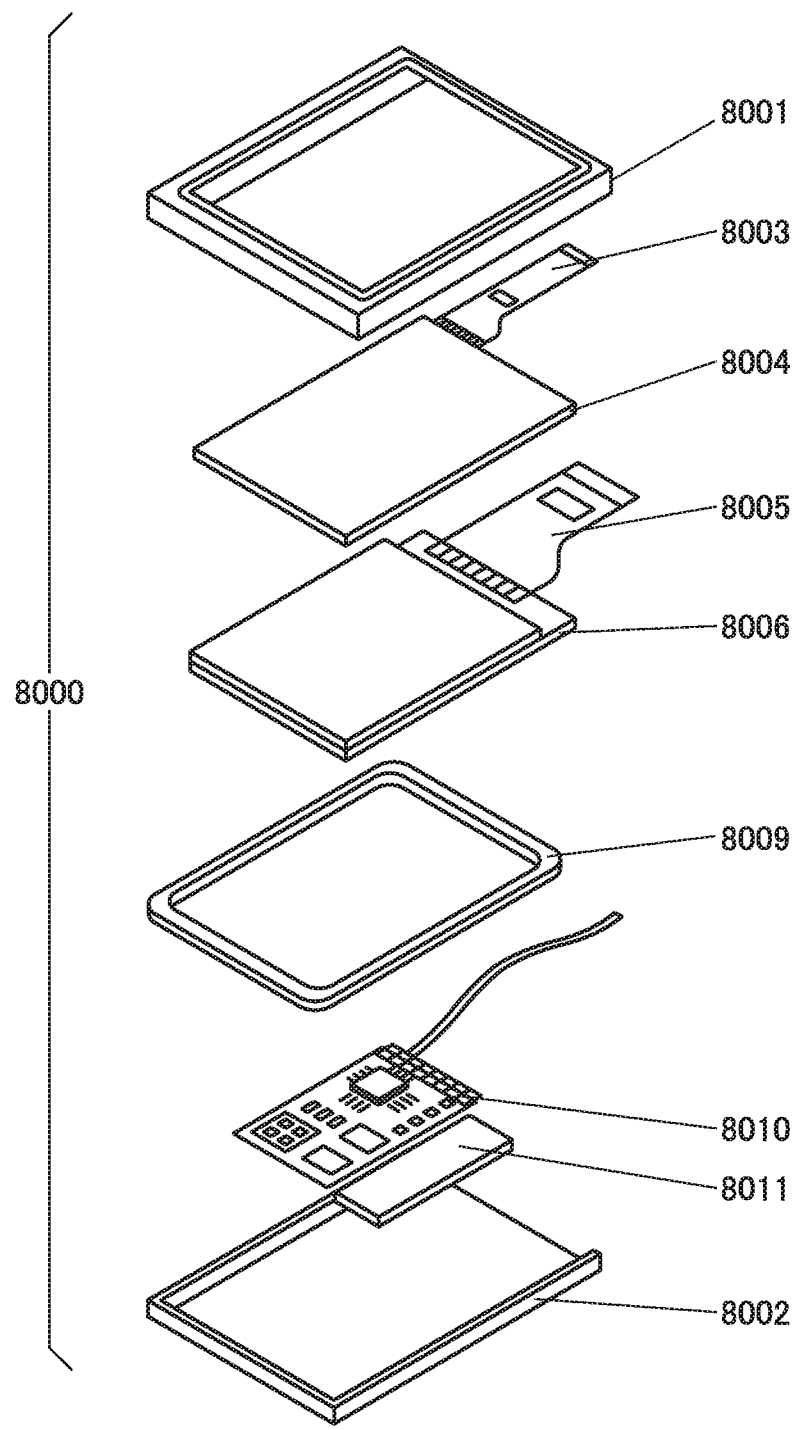
FIG. 11 is a perspective view illustrating a display module of one embodiment of the present invention.

In a display module 8000 in FIG. 11, a touch sensor 8004 connected to an FPC 8003, a display device 8006 connected to an FPC 8005, a frame 8009, a printed board 8010, and a battery 8011 are provided between an upper cover 8001 and a lower cover 8002.

The display device of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also functions as an electromagnetic shield for blocking electromagnetic waves generated by the operation of the printed board 8010. The frame 8009 can also function as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

<Electronic Device>

FIGS. 12A to 12G illustrate electronic devices. These electronic devices can each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like. In addition, the sensor 9007 may have a function of measuring biological information like a pulse sensor and a finger print sensor.

The electronic devices illustrated in FIGS. 12A to 12G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 12A to 12G are not limited to those described above, and the electronic devices can have a variety of functions. Although not illustrated in FIGS. 12A to 12G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 12A to 12G will be described in detail below.

Figure 12A:
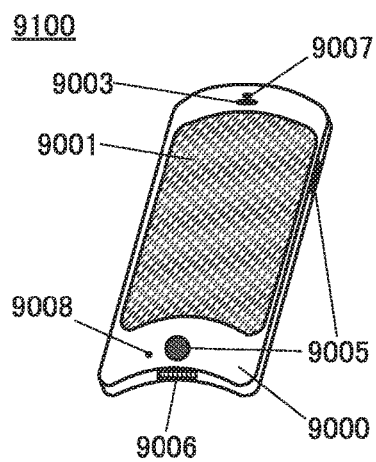
FIGS. 12A to 12G illustrate electronic devices of one embodiment of the present invention.

FIG. 12A is a perspective view of a portable information terminal 9100. The display portion 9001 of the portable information terminal 9100 is flexible. Therefore, the display portion 9001 can be incorporated along a bent surface of the bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 12D:
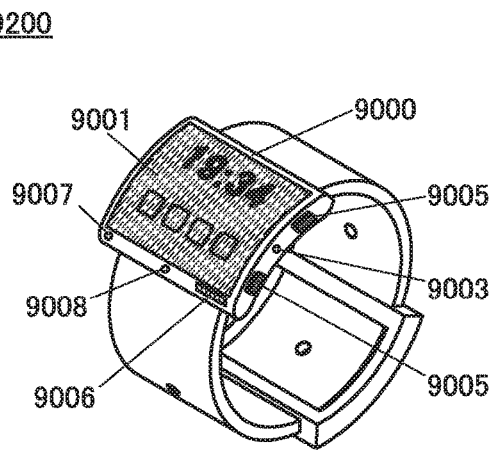
Figure 12B:
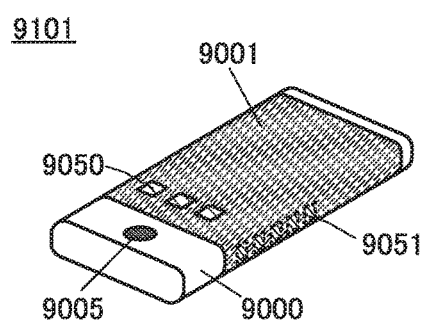

FIG. 12B is a perspective view of a portable information terminal 9101. The portable information terminal 9101 functions as, for example, one or more of a telephone set, a notebook, an information browsing system, and the like. Specifically, the portable information terminal can be used as a smartphone. Note that the speaker 9003, the connection terminal 9006, the sensor 9007, and the like, which are not shown in FIG. 12B, can be positioned in the portable information terminal 9101 as in the portable information terminal 9100 shown in FIG. 12A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and display indicating the strength of a received signal such as a radio wave. Instead of the information 9051, the operation buttons 9050 or the like may be displayed on the position where the information 9051 is displayed.

As a material of the housing 9000, for example, an alloy, a plastic, or a ceramic can be used. As a plastic, a reinforced plastic can also be used. A carbon fiber reinforced plastic (CFRP), which is a kind of reinforced plastic, has advantages of lightweight and corrosion-free. Other examples of reinforced plastics include one including glass fiber and one including aramid fiber. The alloy includes aluminum alloy and magnesium alloy. In particular, amorphous alloy (also referred to as metal glass) containing zirconium, copper, nickel, and titanium is superior in terms of high elastic strength. This amorphous alloy includes a glass transition region at room temperature, which is also referred to as a bulk-solidifying amorphous alloy and substantially has an amorphous atomic structure. By a solidification casting method, an alloy material is molded in a mold of at least part of the housing and coagulated so that the part of the housing is formed using a bulk-solidifying amorphous alloy. The amorphous alloy may include, in addition to zirconium, copper, nickel, and titanium, beryllium, silicon, niobium, boron, gallium, molybdenum, tungsten, manganese, iron, cobalt, yttrium, vanadium, phosphorus, carbon, or the like. The amorphous alloy may be formed by a vacuum evaporation method, a sputtering method, an electroplating method, an electroless plating method, or the like instead of the solidification casting method. The amorphous alloy may include a microcrystal or a nanocrystal as long as a state without a long-range order (a periodic structure) is maintained as a whole. Note that the term alloy refer to both a complete solid solution alloy which has a single solid phase structure and a partial solution that has two or more phases. The housing 9000 using the amorphous alloy can have high elastic strength. Even if the portable information terminal 9101 is dropped and the impact causes temporary deformation, the use of the amorphous alloy in the housing 9000 allows a return to the original shape; thus, the impact resistance of the portable information terminal 9101 can be improved.

Figure 12E:
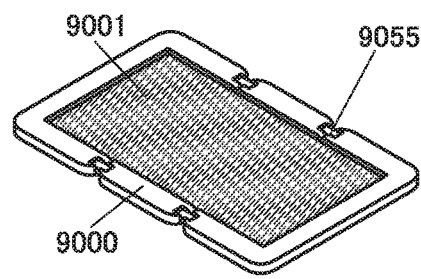
Figure 12C:
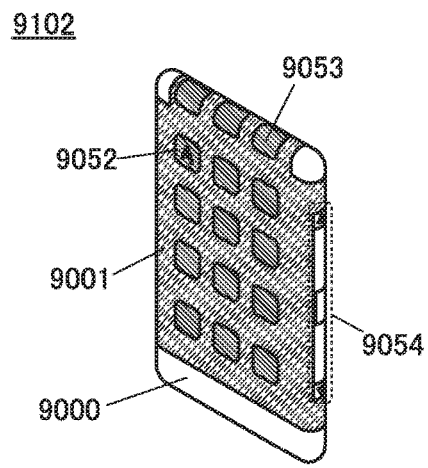

FIG. 12C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

FIG. 12D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 12F:
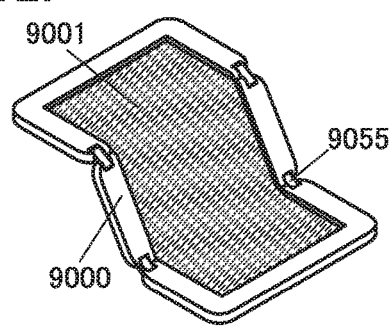
Figure 12G:
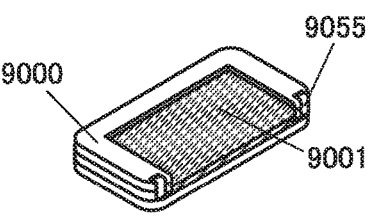

FIGS. 12E, 12F, and 12G are perspective views of a foldable portable information terminal 9201. FIG. 12E is a perspective view illustrating the portable information terminal 9201 that is opened. FIG. 12F is a perspective view illustrating the portable information terminal 9201 that is being opened or being folded. FIG. 12G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

Examples of electronic devices are a television set (also referred to as a television or a television receiver), a monitor of a computer or the like, a digital camera, a digital video camera, a digital photo frame, a mobile phone handset (also referred to as a mobile phone or a mobile phone device), a goggle-type display (a head mounted display), a portable game machine, a portable information terminal, an audio reproducing device, and a large-sized game machine such as a pachinko machine.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for non-contact power transmission.

The electronic devices described in this embodiment each include the display portion for displaying some sort of data. Note that the light-emitting element of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be used in appropriate combination with the structure described in any of the other embodiments.

Example 1

In this example, samples each including a resin layer that can be used in the display device of one embodiment of the present invention were formed, and the samples were subjected to elementary analysis by EDX. Furthermore, a transistor was formed over a resin layer, and the electrical characteristics of the transistor were measured.
<Formation of Sample>
In this example, Sample A and Sample B were formed. The samples were each formed by forming a resin layer over a glass substrate. The resin layers of Sample A and Sample B were formed of different materials.

In Sample A, a material having photosensitivity (a photosensitive material) was used. Specifically, a material containing a compound that absorbs light and a resin material that becomes polyimide after polymerization was used to form the resin layer. First, the material was applied to the glass substrate by spin coating. Then, the applied material was polymerized by heating, so that the resin layer was formed. Note that the thickness of the resin layer was approximately 2 µm.

Figure 13A:
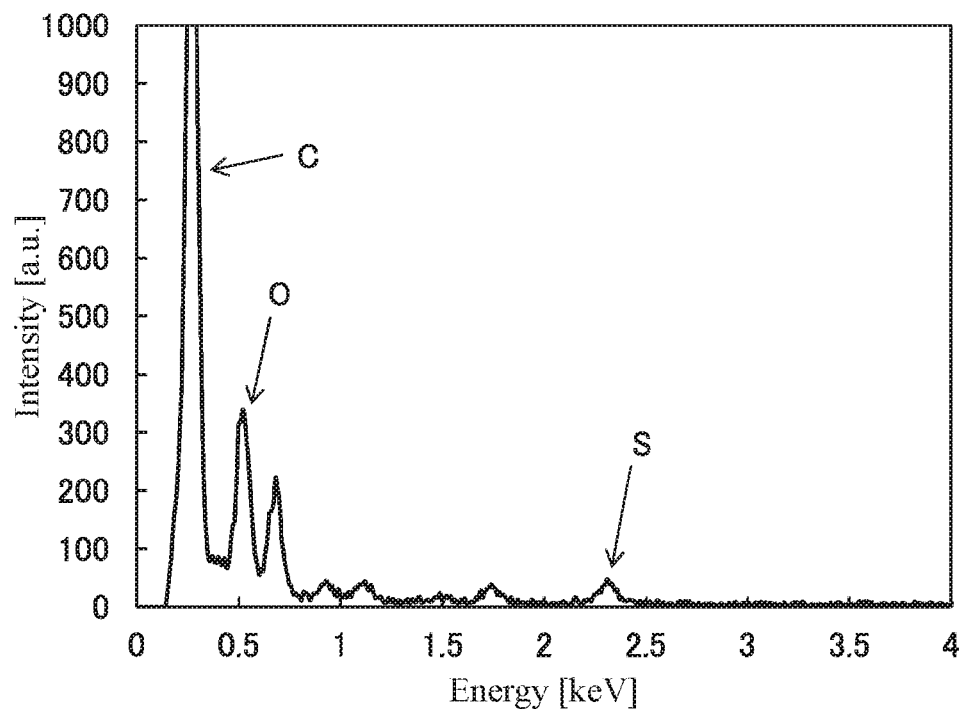
FIGS. 13A and 13B show EDX analysis results of samples of Example.
Figure 13B:
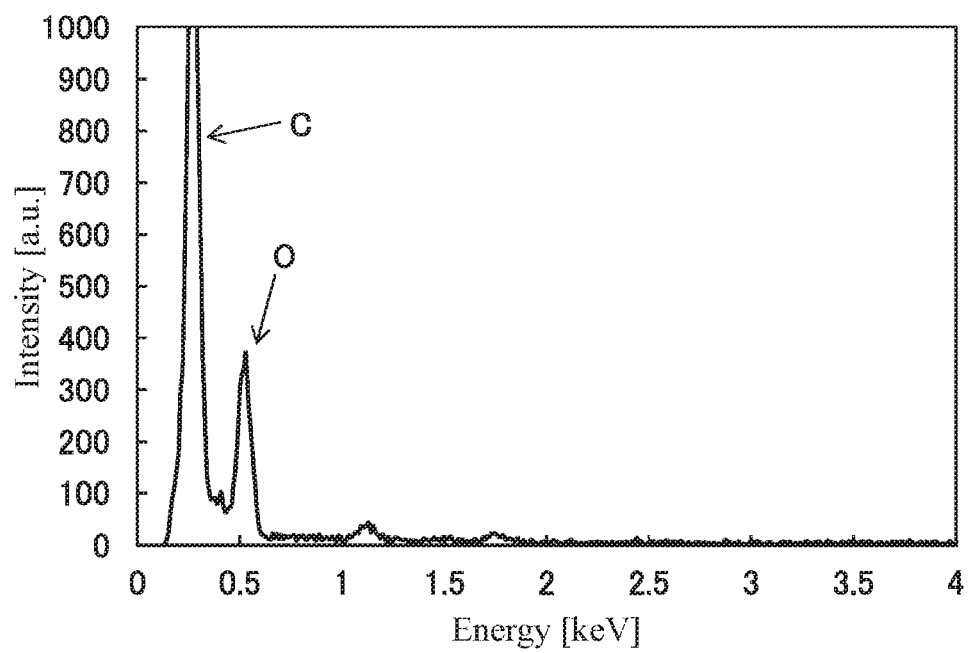

In Sample B, a material that does not have photosensitivity (a non-photosensitive material) was used. Specifically, a material containing a thermosetting resin material that becomes polyimide after polymerization was used to form the resin layer. First, the material was applied to the glass substrate by spin coating. Then, the applied material was polymerized by heating, so that the resin layer was formed. Note that the thickness of the resin layer was approximately 7 µm.
<EDX Analysis Results>
Sample A and Sample B were subjected to elementary analysis by EDX. FIGS. 13A and 13B show the EDX analysis results. In FIGS. 13A and 13B, the vertical axis represents detection intensity, and the horizontal axis represents energy [keV]. FIG. 13A shows the measurement results of Sample A, and FIG. 13B shows the measurement results of Sample B.

As shown in FIG. 13A, sulfur (S) was detected in Sample A in addition to carbon (C) and oxygen (O). Meanwhile, as shown in FIG. 13B, carbon (C) and oxygen (O) were mainly detected in Sample B. As described above, the resin layer in Sample A was formed using a photosensitive material, whereas the resin layer in Sample B was formed using a non-photosensitive material. In this example, a peak of sulfur that was not observed in the EDX measurement results of Sample B was observed in the EDX measurement results of Sample A. Thus, it was confirmed that sulfur originating in the compound that absorbs light is detected in Sample A.
<Measurement of Absorptance>
The absorptance of Sample A was measured. The measurement results of the absorptance are shown in FIG. 14.

Figure 14:
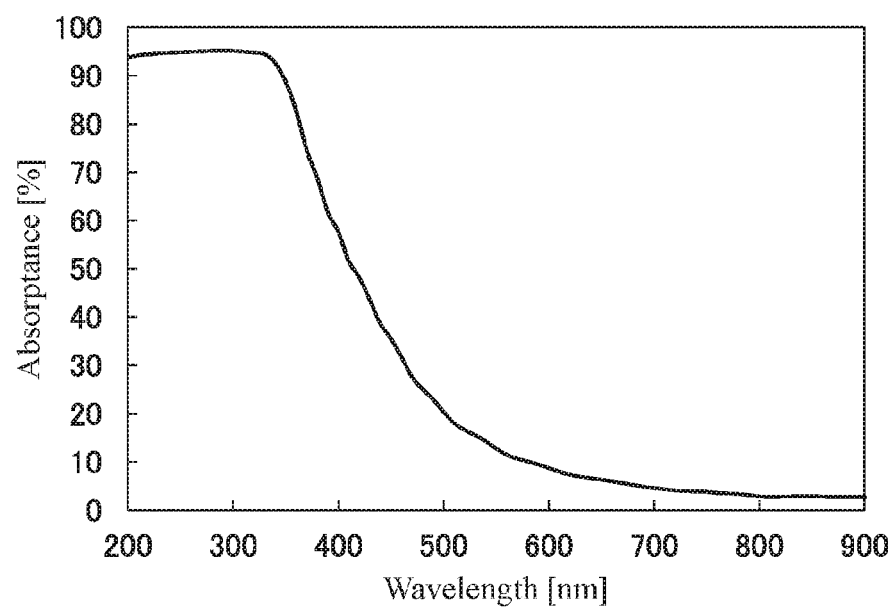
FIG. 14 shows the measurement results of the absorptance of a sample of Example.

As shown in FIG. 14, the absorptance in a wavelength range from 200 nm to 350 nm was high in Sample A. That is, it is determined that Sample A is suitable for the resin layer that can absorb light such as excimer laser light with a wavelength of 308 nm and functions as a separation layer.
<Manufacture of Transistor>
Next, results of comparing electrical characteristics of a transistor before and after being separated from a support substrate are described. Note that the transistor was formed over the support substrate with the resin layer provided therebetween. The resin layer is the same as that used in Sample A.

The structure of the transistor fabricated in this example is similar to the transistor 110 in FIG. 1A and the like.

As the support substrate 61, an approximately 0.7-mm-thick glass substrate was used. As the resin layer 101, an approximately 1.55-µm-thick polyimide resin film was used. As the insulating layer 131, an approximately 200-nm-thick silicon oxynitride film was used. As the conductive layer 115 functioning as a back gate electrode of the transistor, an approximately 100-nm-thick titanium film was used. As the insulating layer 137, a stack of an approximately 400-nm-thick silicon nitride film and an approximately 50-nm-thick silicon oxynitride film was used. As the semiconductor layer 112, an approximately 40-nm-thick In—Ga—Zn oxide semiconductor film formed using an oxide target of In:Ga:Zn=4:2:3 was used. As the insulating layer 132, an approximately 150-nm-thick silicon oxynitride film was used. As the conductive layer 111 functioning as a gate electrode of the transistor, an approximately 100-nm-thick In—Ga—Zn oxide film formed using an oxide target of In:Ga:Zn=4:2:3 was used. As the insulating layer 133, a stack of an approximately 100-nm-thick silicon nitride film and an approximately 300-nm-thick silicon oxynitride film was used. As the conductive layers 113a and 113b, a stack of an approximately 10-nm-thick titanium film and an approximately 100-nm-thick copper film was used. As the insulating layer 134, an approximately 1.5-µm-thick acrylic resin film was used.
<Measurement of Electrical Characteristics of Transistor>
The $I_d$-$V_g$ characteristics (drain current-gate voltage characteristics) of the above transistor were measured. The measurement conditions were different as follows before and after separation of the support substrate. Before the separation, the $I_d$-$V_g$ characteristics were measured in such a manner that the drain voltage was set to 0.1 V or 20 V and the back gate voltage and the gate voltage were swept from −8 V to 8 V in increments of 0.25 V. After the separation, the $I_d$-$V_g$ characteristics were measured in such a manner that the drain voltage was set to 0.1 V or 10 V and the back gate voltage and the gate voltage were swept from −8 V to 8 V in increments of 0.25 V.

Measurement results of the $I_d$-$V_g$ characteristics are shown in FIGS. 15A and 15B. FIGS. 15A and 15B show the measurement results of transistors before and after separation that each have a channel length L of 6 µm and a channel width W of 50 µm. In FIGS. 15A and 15B, the horizontal axis represents gate voltage $V_g$ [V], the left vertical axis represents drain current $I_d$ [A], and the right vertical axis represents field-effect mobility $\mu_{FE}$ [cm$^2$/Vs]. In addition, in FIGS. 15A and 15B, a solid line indicates $I_d$-$V_g$ characteristics at a drain voltage of 10 V or 20 V, a dashed-dotted line indicates $I_d$-$V_g$ characteristics at a drain voltage of 0.1 V, and a dashed line indicates field-effect mobility $\mu_{FE}$ at a drain voltage of 10 V or 20 V. The transistors measured before and after separation are different transistors formed over the same resin layer 101.

As shown in FIGS. 15A and 15B, it is found that there is little difference between the electrical characteristics of the transistor formed over the resin layer before and after separation of the support substrate from the resin layer.

The example described above suggests that the support substrate can be separated from the resin layer without influencing the electrical characteristics of the transistor provided over the resin layer.

This application is based on Japanese Patent Application serial no. 2016-082072 filed with Japan Patent Office on Apr. 15, 2016, the entire contents of which are hereby incorporated by reference.

What is claimed is:

1. A display device comprising:
a flexible substrate;
an adhesive layer over the flexible substrate;
a first resin layer over the adhesive layer;
an inorganic insulating layer over the first resin layer;
a transistor over the inorganic insulating layer; and
a display element electrically connected to the transistor,
wherein the transistor includes an oxide semiconductor in a channel formation region, and
wherein the first resin layer comprises sulfur.

2. The display device according to claim 1,
wherein the first resin layer comprises a first compound, and
wherein the first compound has a sulfonyl group.

3. The display device according to claim 2, wherein the first compound has one of or both a quinone diazide skeleton and an indenecarbonyl skeleton.

4. The display device according to claim 2, wherein the first compound has a property of absorbing light.

5. The display device according to claim 1,
wherein the first resin layer comprises a second compound, and
wherein the second compound has an imide skeleton.

6. The display device according to claim 1, wherein a thickness of the first resin layer is greater than or equal to 0.1 µm and less than or equal to 3 µm.

7. The display device according to claim 1, further comprising a second resin layer over the transistor,
wherein the second resin layer comprises sulfur.

8. The display device according to claim 7, further comprising a third resin layer over the display element,
wherein the third resin layer comprises sulfur.

9. An electronic device comprising:
the display device according to claim 1; and
one of or both a housing and a touch sensor.

10. A display device comprising:
a flexible substrate;
an adhesive layer over the flexible substrate;
a first resin layer over the adhesive layer;
an inorganic insulating layer over the first resin layer;
a transistor over the inorganic insulating layer; and
a display element electrically connected to the transistor,
wherein the first resin layer comprises sulfur and nitrogen, and
wherein intensity of the sulfur is higher than intensity of the nitrogen in a measurement of the first resin layer by energy dispersive X-ray spectroscopy.

11. The display device according to claim 10,
wherein the first resin layer comprises a first compound, and
wherein the first compound has a sulfonyl group.

12. The display device according to claim 11, wherein the first compound has a quinone diazide skeleton or an indenecarbonyl skeleton, or both the quinone diazide skeleton and the indenecarbonyl skeleton.

13. The display device according to claim 11, wherein the first compound has a property of absorbing light.

14. The display device according to claim 11,
wherein the first resin layer comprises a second compound, and
wherein the second compound has an imide skeleton.

15. The display device according to claim 10, wherein a thickness of the first resin layer is greater than or equal to 0.1 µm and less than or equal to 3 µm.

16. The display device according to claim 10, further comprising a second resin layer over the transistor,
wherein the second resin layer comprises sulfur.

17. The display device according to claim 16, further comprising a third resin layer over the display element,
wherein the third resin layer comprises sulfur.

18. The display device according to claim 10, wherein the transistor comprises an oxide semiconductor in a channel formation region.

19. An electronic device comprising:
the display device according to claim 10,
wherein the electronic device is any one of a television, a monitor of a computer or the like, a digital camera, a digital video camera, a digital photo frame, a mobile phone device, a goggle-type display, a portable game machine, a portable information terminal, an audio reproducing device and a game machine.

20. A display device comprising:
a flexible substrate;
an adhesive layer over the flexible substrate;
a first resin layer over the adhesive layer;
an inorganic insulating layer over the first resin layer;
a transistor over the inorganic insulating layer; and
a display element electrically connected to the transistor,
wherein the first resin layer comprises a first resin, and
wherein the first resin has a sulfonyl group.

21. The display device according to claim 20, wherein the first resin further comprises an imide skeleton.

22. The display device according to claim 20, wherein the sulfonyl group is included in a quinone diazide sulfonyl skeleton.

23. The display device according to claim 20, wherein the first resin has a property of absorbing light having a wavelength of greater than or equal to 300 nm and less than or equal to 400 nm.

24. The display device according to claim 20, wherein the first resin has a property of transmitting visible light.

25. The display device according to claim 20, wherein a thickness of the first resin layer is greater than or equal to 0.1 µm and less than or equal to 3 µm.

26. The display device according to claim 20, wherein the transistor comprises an oxide semiconductor.

* * * * *